United States Patent
Phou et al.

(10) Patent No.: US 12,319,444 B1
(45) Date of Patent: Jun. 3, 2025

(54) SYSTEMS AND METHODS CONFIGURED FOR SIMULATING SPACE-BASED IMAGING OF RESIDENT SPACE OBJECTS

(71) Applicant: NorthStar Earth & Space Inc., Montreal (CA)

(72) Inventors: Naron Phou, Montreal (CA); Jean-Claude Leclerc, Montreal (CA); Philippe Sevigny, Saint Leonard (CA); Narendra Gollu, Montreal (CA); Peter Klimas, Ottawa (CA); Daniel O'Connell, Saint Lazare (CA)

(73) Assignee: NORTHSTAR EARTH & SPACE INC., Montreal (CA)

( * ) Notice: Subject to any disclaimer, the term of this patent is extended or adjusted under 35 U.S.C. 154(b) by 0 days.

(21) Appl. No.: 18/737,287

(22) Filed: Jun. 7, 2024

(51) Int. Cl.
*B64G 1/10* (2006.01)
*B64G 1/68* (2006.01)
*G06F 30/20* (2020.01)
*G06V 10/00* (2022.01)
*G06V 20/13* (2022.01)

(52) U.S. Cl.
CPC .......... *B64G 1/1085* (2013.01); *B64G 1/68* (2013.01); *G06F 30/20* (2020.01); *G06V 10/00* (2022.01); *G06V 20/13* (2022.01)

(58) Field of Classification Search
CPC ......... B64G 1/1085; B64G 1/68; G06F 30/20; G06V 10/00; G06V 20/13
USPC ............................................................ 703/8
See application file for complete search history.

(56) References Cited

PUBLICATIONS

Hagerty_2016 (A high fidelity approach to data simulation for space situational awareness missions, advanced maui optical space surveillance technologies conference (AMOS) 2016) (Year: 2016).*

(Continued)

*Primary Examiner* — Brian S Cook
(74) *Attorney, Agent, or Firm* — Greenberg Traurig, LLP

(57) ABSTRACT

Systems and methods of the present disclosure enable simulation of imaging of resident space objects (RSOs) by one or more space-based image sensors. The simulation includes obtaining a satellite constellation configuration having satellite configuration parameters for at least one satellite in a constellation of satellites. The simulation also includes obtaining an RSO configuration having RSO configuration parameters RSOs. The simulation may use the satellite and RSO configuration parameters to simulate constellation ephemeris data for each of the satellites and RSOs. Based on the position of each RSO and satellite, detectability of each RSO by each satellite is simulated based on a photometry simulation using the satellite configuration parameters, including sensor characteristics of a simulated sensor. Imagery may also be simulated based on an image generation model, the sensor configuration, the photometry simulation and at least one background model.

22 Claims, 15 Drawing Sheets

(56) References Cited

PUBLICATIONS

Clark_2021 (Simulation of RSO Images for Space Situation Awareness (SSA) Using Parallel Processing, Sensors 2021) (Year: 2021).*
Allworth_2020 (Development of a high fidelity simulator for Generalized photometric based space object classification using machine learning, 70th International Astronautical Congress (IAC) 2019) (Year: 2019).*
Jordan_2023 (Quasi Real-Time Autonomous Satellite Detection and Orbit Estimation, 2023) (Year: 2023).*
Helferty_2023 (Performance Analysis of Satellite Tracking Algorithms in Low SNR Environments, Advanced Maui Optical and Space Surveillance Technologies Conference (AMOS) 2023). (Year: 2023).*

* cited by examiner

SYSTEMS AND METHODS CONFIGURED FOR SIMULATING SPACE-BASED IMAGING OF RESIDENT SPACE OBJECTS

FIELD OF TECHNOLOGY

The present disclosure generally relates to systems configured for simulating space-based imaging of resident space objects (RSOs), including simulated event finding, object detection and generation of simulated images.

BACKGROUND OF TECHNOLOGY

Satellites in Earth orbit enable technologies such as inter-continental communication, precision navigation, weather forecasting, earth imaging, and astronomical observations, to name a few. However, with the number of these orbiting satellites rapidly approaching 10,000, these satellites may create space debris when decommissioned subjecting the other satellites in orbit to possible space debris collisions. Currently, there may be over 35,000 space debris objects greater than 10 cm and over 1,000,000 space debris objects between 1 cm and 10 cm.

SUMMARY OF DESCRIBED SUBJECT MATTER

In some aspects, the techniques described herein relate to a method including: receiving, by at least one processor, a satellite constellation configuration including satellite configuration parameters for at least one satellite in a constellation of satellites; wherein the satellite constellation configuration includes: at least one satellite geometry representing physical characteristics of the at least one satellite, and at least one sensor configuration representing sensor parameters of at least one sensor on board the at least one satellite; receiving, by the at least one processor, a resident space object (RSO) configuration including RSO configuration parameters for a plurality of RSOs, the RSO configuration including RSO geometry data representing physical characteristics of the plurality of RSOs; simulating, by the at least one processor, constellation ephemeris data including ephemerides of the at least one satellite of the constellation of satellites so as to define at least one satellite orbit propagation of the at least one satellite over a simulation period, based at least in part on the satellite constellation configuration; simulating, by the at least one processor, RSO ephemeris data including ephemerides of the plurality of RSOs so as to define, for each RSO of the plurality of RSOs, at least one RSO orbit propagation over the simulation period, based at least in part on the RSO configuration; determining, by the at least one processor, a plurality of candidate detection events representing a subset of the plurality of RSO kernels that, based on the constellation ephemeris data, is within a field-of-view (FOV) of the at least one satellite during the simulation period based at least in part on the plurality of observer kernels and the at least one sensor configuration; simulating, by the at least one processor, at least one detectable event of the plurality of candidate detection events, based at least in part on: at least one detectability model, the at least one sensor configuration and a plurality of detectability parameters; wherein the plurality of detectability parameters includes: at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs; simulating, by the at least one processor, at least one simulated image of the at least one detectable event for at least one particular RSO, based at least in part on: at least one image generation model, the at least one sensor configuration and a plurality of image simulation parameters; wherein the plurality of image simulation parameters include: the at least one photometry model based at least in part on the at least one sensor configuration, and the at least one background definition defining contents of a background of the FOV; outputting, by the at least one processor, the at least one event image associated with the at least one particular RSO so as to allow to perform at least one action associated with the at least one particular RSO.

In some aspects, the techniques described herein relate to a method, wherein the satellite constellation configuration includes at least one satellite orbit data representing orbital parameters of the at least one satellite;

In some aspects, the techniques described herein relate to a method, further including: simulating, by the at least one processor, constellation ephemeris data including ephemerides of the at least one satellite of the constellation of satellites so as to define at least one satellite orbit propagation of the at least one satellite over a simulation period, based at least in part on: at least one satellite constellation numerical propagator, at least one satellite force model, and the satellite constellation configuration; wherein the at least one satellite constellation numerical propagator outputs a plurality of observer kernels for the at least one satellite, the plurality of observer kernels defining the constellation ephemeris data of the at least one satellite.

In some aspects, the techniques described herein relate to a method, further including: simulating, by the at least one processor, RSO ephemeris data including ephemerides of the plurality of RSOs so as to define, for each RSO of the plurality of RSOs, at least one RSO orbit propagation over the simulation period, based at least in part on: at least one RSO numerical propagator, at least one RSO force model, and the RSO configuration; wherein the at least one RSO numerical propagator outputs a plurality of RSO kernels for the plurality of RSOs, the plurality of RSO kernels defining the RSO ephemeris data of the plurality of RSOs.

In some aspects, the techniques described herein relate to a method, further including: calculating, by the at least one processor, at least one statistic for the at least one event image associated with the at least one particular RSO; wherein the at least one statistic is indicative of a performance of the at least one sensor configuration based at least in part on at least one of the at least one detectable event associated with the at least one particular RSO or the at least one event image associated with the at least one particular RSO.

In some aspects, the techniques described herein relate to a method, wherein the plurality of image simulation parameters include at least one intrack/offtrack pixel uncertainty.

In some aspects, the techniques described herein relate to a method, further including: accessing, by the at least one processor, at least one RSO catalog including two-line element data representing two-line elements of the plurality of RSOs.

In some aspects, the techniques described herein relate to a method, wherein the at least one detectability model utilizes the at least one photometry model to simulate: a signal representing a first sensor output resulting from the subset of the plurality of RSO kernels being in the FOV of the at least one satellite based at least in part on the at least one sensor configuration, noise representing a second sensor output resulting from at least one background definition, at least one straylight model and at least one slew correction based at least in part on the at least one sensor configuration, and an SNR based at least in part on the signal and the noise.

In some aspects, the techniques described herein relate to a method, wherein the image generation model is configured to: simulate star background imagery to depict the contents of the background based on the at least one background definition; simulate event imagery for the subset of the plurality of RSOs associated with the at least one detectable event based at least in part on the at least one photometry model, the at least one RSO configuration and the at least one sensor configuration; and generate at least one event image based at least in part on the star background imagery and the event imagery.

In some aspects, the techniques described herein relate to a method, wherein the image generation model is further configured to: simulate noise imagery for the noise based at least in part on the at least one photometry model, the at least one sensor configuration and the noise; and generate at least one event image based at least in part on the star background imagery, the event imagery and the noise imagery.

In some aspects, the techniques described herein relate to a system including: at least one processor in communication with at least one non-transitory computer readable medium having software instructions stored thereon, wherein the at least one processor is, upon execution of the software instructions, configured to: receive a satellite constellation configuration including satellite configuration parameters for at least one satellite in a constellation of satellites; wherein the satellite constellation configuration includes: at least one satellite geometry representing physical characteristics of the at least one satellite, and at least one sensor configuration representing sensor parameters of at least one sensor on board the at least one satellite; receive a resident space object (RSO) configuration including RSO configuration parameters for a plurality of RSOs, the RSO configuration including RSO geometry data representing physical characteristics of the plurality of RSOs; simulate constellation ephemeris data including ephemerides of the at least one satellite of the constellation of satellites so as to define at least one satellite orbit propagation of the at least one satellite over a simulation period, based at least in part on the satellite constellation configuration; simulate RSO ephemeris data including ephemerides of the plurality of RSOs so as to define, for each RSO of the plurality of RSOs, at least one RSO orbit propagation over the simulation period, based at least in part on the RSO configuration; determine a plurality of candidate detection events representing a subset of the plurality of RSO kernels that, based on the constellation ephemeris data, is within a field-of-view (FOV) of the at least one satellite during the simulation period based at least in part on the plurality of observer kernels and the at least one sensor configuration; simulate at least one detectable event of the plurality of candidate detection events, based at least in part on: at least one detectability model, the at least one sensor configuration and a plurality of detectability parameters; wherein the plurality of detectability parameters includes: at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs; simulate at least one simulated image of the at least one detectable event for at least one particular RSO, based at least in part on: at least one image generation model, the at least one sensor configuration and a plurality of image simulation parameters; wherein the plurality of image simulation parameters include: the at least one photometry model based at least in part on the at least one sensor configuration, and the at least one background definition defining contents of a background of the FOV; output the at least one event image associated with the at least one particular RSO so as to allow to perform at least one action associated with the at least one particular RSO.

In some aspects, the techniques described herein relate to a system, wherein the satellite constellation configuration includes at least one satellite orbit data representing orbital parameters of the at least one satellite.

In some aspects, the techniques described herein relate to a system, wherein the at least one processor, upon execution of the software instructions, is further configured to: simulate constellation ephemeris data including ephemerides of the at least one satellite of the constellation of satellites so as to define at least one satellite orbit propagation of the at least one satellite over a simulation period, based at least in part on: at least one satellite constellation numerical propagator, at least one satellite force model, and the satellite constellation configuration; wherein the at least one satellite constellation numerical propagator outputs a plurality of observer kernels for the at least one satellite, the plurality of observer kernels defining the constellation ephemeris data of the at least one satellite.

In some aspects, the techniques described herein relate to a system, wherein the at least one processor, upon execution of the software instructions, is further configured to: simulate RSO ephemeris data including ephemerides of the plurality of RSOs so as to define, for each RSO of the plurality of RSOs, at least one RSO orbit propagation over the simulation period, based at least in part on: at least one RSO numerical propagator, at least one RSO force model, and the RSO configuration; wherein the at least one RSO numerical propagator outputs a plurality of RSO kernels for the plurality of RSOs, the plurality of RSO kernels defining the RSO ephemeris data of the plurality of RSOs.

In some aspects, the techniques described herein relate to a system, wherein the at least one processor, upon execution of the software instructions, is further configured to: calculate at least one statistic for the at least one event image associated with the at least one particular RSO; wherein the at least one statistic is indicative of a performance of the at least one sensor configuration based at least in part on at least one of the at least one detectable event associated with the at least one particular RSO or the at least one event image associated with the at least one particular RSO.

In some aspects, the techniques described herein relate to a system, wherein the plurality of image simulation parameters includes at least one intrack/offtrack pixel uncertainty.

In some aspects, the techniques described herein relate to a system, wherein the at least one processor, upon execution of the software instructions, is further configured to: access at least one RSO catalog including two-line element data representing two-line elements of the plurality of RSOs.

In some aspects, the techniques described herein relate to a system, wherein the at least one detectability model utilizes the at least one photometry model to simulate: a signal representing a first sensor output resulting from the subset of the plurality of RSO kernels being in the FOV of the at least one satellite based at least in part on the at least one sensor configuration, noise representing a second sensor output resulting from at least one background definition, at least one straylight model and at least one slew correction based at least in part on the at least one sensor configuration, and an SNR based at least in part on the signal and the noise.

In some aspects, the techniques described herein relate to a system, wherein the image generation model is configured to: simulate star background imagery to depict the contents of the background based on the at least one background definition; simulate event imagery for the subset of the plurality of RSOs associated with the at least one detectable event based at least in part on the at least one photometry model, the at least one RSO configuration and the at least one sensor configuration; and generate at least one event image based at least in part on the star background imagery and the event imagery.

In some aspects, the techniques described herein relate to a system, wherein the image generation model is further configured to: simulate noise imagery for the noise based at least in part on the at least one photometry model, the at least one sensor configuration and the noise; and generate at least one event image based at least in part on the star background imagery, the event imagery and the noise imagery.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

DETAILED DESCRIPTION

Figure 1:
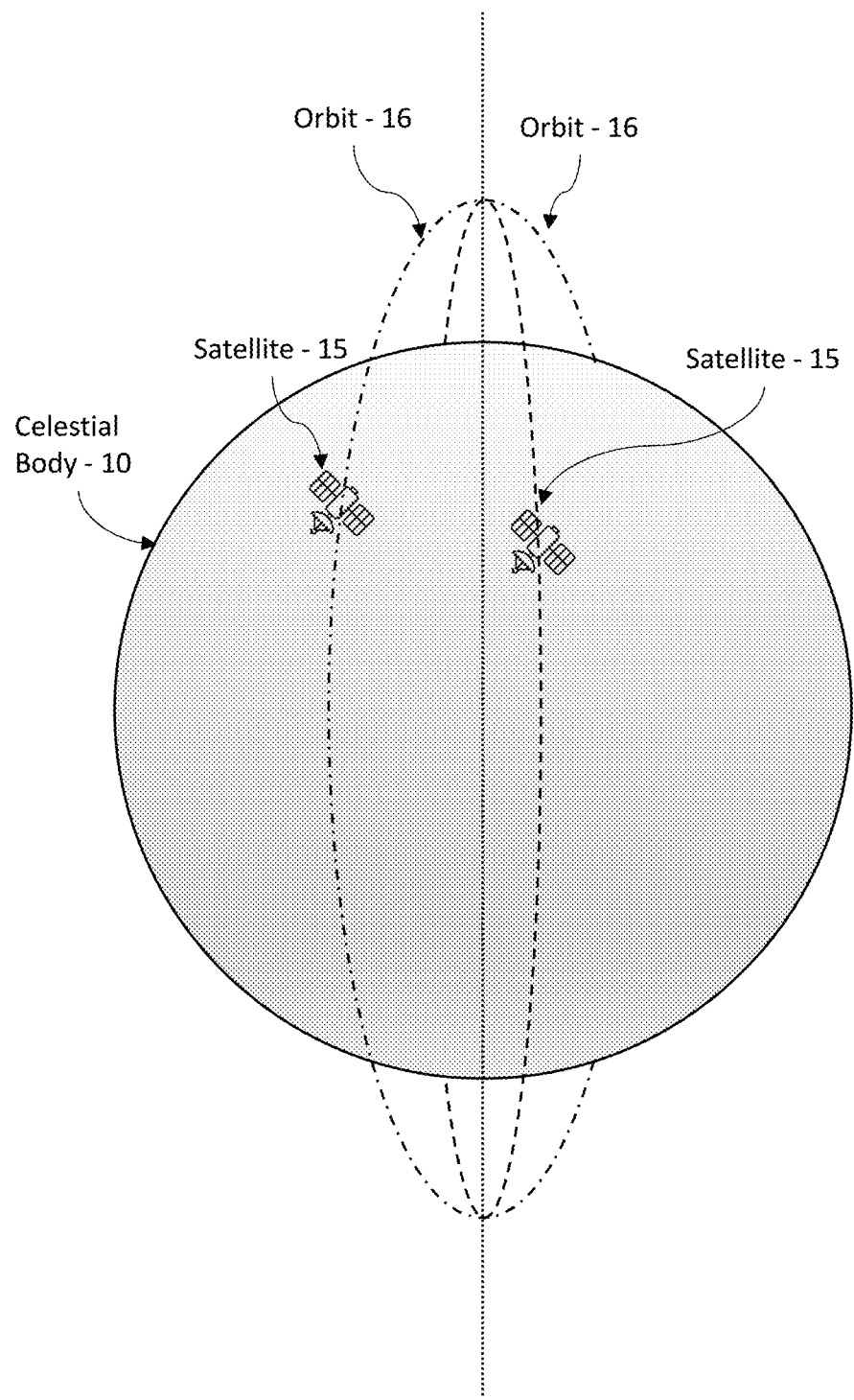
FIG. 1 depicts a schematic diagram illustrating satellites orbiting a celestial body in accordance with one or more embodiments of the present disclosure.

Various detailed embodiments of the present disclosure, taken in conjunction with the accompanying FIGs., are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the terms "and" and "or" may be used interchangeably to refer to a set of items in both the conjunctive and disjunctive in order to encompass the full description of combinations and alternatives of the items. By way of example, a set of items may be listed with the disjunctive "or", or with the conjunction "and." In either case, the set is to be interpreted as meaning each of the items singularly as alternatives, as well as any combination of the listed items.

FIGS. 1 through 14 illustrate systems and methods of simulating RSO detection and/or image generation based on one or more image sensor configurations of one or more satellites in orbit about a celestial body.

As more and more satellites are deployed into Earth orbit, there is a higher probability of collisions between space debris and important satellites. Velocities of space debris in orbit about a celestial body such as the Earth may be so high that even the smallest pieces of space debris may cause significant, possibly catastrophic damage. Thus, as the number of a resident space objects (RSO) in orbit about the earth grows, there is a need in the art to detect, identify and map the RSOs in space for RSO identification, RSO orbital determination, predictive RSO conjunction analysis, and RSO collision assessment.

Indeed, there is over 35,000 space debris objects greater than 10 cm, and over 1,000,000 space debris objects between 1 cm and 10 cm. Much of such debris poses hazards to other satellites and equipment in space. However, cataloging of the space debris is inadequate. Thus, detection of the RSOs represents a technical challenge whereby sensors may be designed to detect RSOs from ground-based and/or space-based positions. However, even the design of such sensors poses technical challenges due to the large multi-factored scenarios of detecting a large number of RSOs with a limited number of sensors. Thus, optimization of the design of such sensors is a way to ensure that one or more sensors can achieve performance targets for detecting and cataloging RSOs. The following embodiments provide technical solutions and technical improvements that overcome technical problems, drawbacks and/or deficiencies in the technical fields involving testing and validation of satellite-based imaging equipment, which typically requires costly physical testing of deployed prototype platforms.

As explained in more detail below, technical solutions and technical improvements herein include aspects of improved testing and validation of imaging equipment and satellite configurations for space-based imaging, detection, and tracking of RSOs. According to aspects of one or more embodiments, the testing and validation as further detailed below includes simulating all aspects of the performance of the satellite and imaging payload in detecting RSOs and generating simulated imagery. According to aspects of one or more embodiments, aspects of the technical solutions include: leveraging numerical propagators, including, e.g., one or more integrators, among other elements, for modelling orbits of both satellites and RSOs, simulating the interaction of light (e.g., from the sun or Earth reflectivity or both) with RSOs, tracking intersections based on the modelled orbits, and/or implementing advance photometry modelling using sensor parameters and albedo parameters to model the strength of a detection signal of an RSO by one or more image sensors based on the interaction of light and the RSO, and to generating simulated imagery of the detection signal using deep space background(s). Accordingly, the field of image sensor and optics performance, such as in the task of object detection in space, is improved by the configuration and coordination of data driven advanced simulation algorithms over a simulated period of time, thus enabling the design, optimization, and deployment of satellite configurations.

Based on such technical features, further technical benefits become available to users and operators of these systems and methods. Moreover, various practical applications of the disclosed technology are also described, which provide further practical benefits to users and operators that are also new and useful improvements in the art.

A resident space object (RSO) may be a natural or artificial object that orbits another body. RSOs may be active and/or inactive and/or natural and/or man-made. For example, RSOs may broadly include, but are not limited to asteroids, comets, meteoroids, (active and/or inactive) satellites, rockets, and/or other space debris such as rocket upper stages, debris from collisions and/or explosions, fragments of paint and/or other materials, and/or micrometeoroids, among others. Collisions between RSOs may generate even more debris, which may further increase a risk of collisions.

Space situational awareness (SSA) may refer to the practice of tracking and/or monitoring RSOs to identify potential hazards and to support safe space operations particularly for government and/or commercial space activities. The number of RSOs in orbit has been increasing in recent years, due to the growing number of space launches, which has made SSA increasingly important. RSOs may be tracked using a variety of ground-based and/or space-based sensors. The data from these sensors may be used to create catalogs of RSOs, which may be used by SSA organizations to identify potential hazards and/or to support safe space operations so as to mitigate the risks posed by RSOs. This risk mitigation may include but is not limited to developing new technologies to track and/or remove RSOs from orbit, as well as developing international standards and regulations for space operations.

Embodiments of the present disclosure herein provide a system and method for simulating the detection and imaging of RSOs in orbit around a celestial body such as the Earth. For example, a constellation of low-cost space-based optical sensor payloads (e.g., imaging cameras) may be simulated for a constellation of simulated satellites in respective orbital planes around the celestial body to assess, prior to deployment of the satellite(s) and/or configuration(s) of the satellite(s), performance of the space-based optical sensor payloads in detecting RSOs.

The term "celestial body" may refer to planets and/or stars with reference to the celestial body such as the Earth.

FIG. 1 depicts a schematic diagram illustrating satellites orbiting a celestial body in accordance with one or more embodiments of the present disclosure.

According to aspects of one or more embodiments, space-based imaging may be simulated by simulating one or more satellites 15 traversing orbit(s) 16 about a celestial body 10, such as the Earth or other planet, moon or body. In deployment, a satellite 15 may orbit the celestial body 10 according to an orbital path 16. Accordingly, imaging of objects in space, including RSOs, is dependent on characteristics of each satellite 15, a constellation of the satellites 15 and the orbits 16 of each satellite 15.

According to aspects of one or more embodiments, a satellite orbit 16 may be the path that a satellite 15 may take around a planet or other celestial object 10. Satellite orbits 16 may be determined by the gravitational pull of the planet or other celestial object 10, as well as the speed and direction at which the satellite 15 may be launched. There are many different types of satellite orbits 16, but the most common may include:

Low Earth orbit (LEO): LEO satellites may orbit the Earth at an altitude of between 160 and 2,000 kilometers. LEO satellites may often be used for communications, navigation, and remote sensing.

Medium Earth orbit (MEO): MEO satellites may orbit the Earth at an altitude of between 2,000 and 35,786 kilometers.

MEO satellites may often be used for global positioning systems (GPS) and communications.

Geosynchronous Earth orbit (GEO): GEO satellites may orbit the Earth at an altitude of 35,786 kilometers, which is the same altitude as the Earth's rotation. Accordingly, GEO satellites may stay over the same spot on the Earth's surface. GEO satellites may be often used for weather forecasting, communications, and television broadcasting.

A cislunar orbit may refer to an orbit in the region between the earth and the orbit of the moon.

Satellite orbits 16 may also be classified by their inclination, which is the angle between the satellite's orbital plane and the Earth's equatorial plane. Satellites 15 with an inclination of 0 degrees orbit may be in the same plane as the Earth's equator, while satellites with an inclination of 90 degrees may orbit directly over the Earth's poles.

Satellite orbits 16 may also be classified by their eccentricity, which may be a measure of how elliptical an orbit is. A perfectly circular orbit may have an eccentricity of 0, while a highly elliptical orbit may have an eccentricity of close to 1. Generally, orbits for which eccentricity is greater than 0.1 may be categorized as highly elliptical.

Note that the above description of satellites in orbit (e.g., the sensor-based satellites) may also be applied to RSOs in orbit around the Earth or a celestial body 10.

According to aspects of one or more embodiments, an orbital plane of an object such as the satellite 15 may be the plane in which it orbits around another object. The orbital plane may be defined by three parameters:

(1) Inclination: The angle between the orbital plane and a reference plane. The reference plane may typically be, for example, the ecliptic plane for objects orbiting the Sun, or the equatorial plane of the central body for objects orbiting a planet or moon.

(2) Longitude of the ascending node: The angle between the reference plane and the line where the orbital plane may cross the reference plane from south to north. LTAN may be a parameter used in orbital mechanics that describes the time of day at which a satellite in a sun-synchronous orbit (SSO) may cross the equator from south to north. SSOs may be designed to keep the satellite at the same local solar time as it passes over any given point on Earth so as to allow for consistent lighting conditions such as for imaging. Examples of LTAN for SSO satellites may be (but not limited to) 10:30 and 13:30 (1:30 PM) because of good lighting conditions and minimization of atmospheric drag.

(3) Argument of periapsis: The angle between the line of nodes (the line connecting the ascending and descending nodes) and the major axis of the ellipse.

The orbital plane of an object may be visualized as a large, flat disk. The object itself may orbit around the celestial body 10 (e.g., the Earth) within this plane. The inclination of the orbital plane may determine how much the plane may be tilted relative to the reference plane. The longitude of the ascending node may determine where the orbital plane may cross the reference plane from south to north. The argument of periapsis may determine where the object may be closest to the celestial body 10 within its orbit. Orbital planes may be used to predict the motion of objects in space. For example, knowing the orbital planes of two objects may be used to predict when the two objects may collide or when one object may occult the other object.

Orbital plane eccentricity may be a measure of how much an orbit deviates from a perfect circle. A circular orbit may have an eccentricity of 0, while a more elliptical orbit may have an eccentricity closer to 1 though an eccentricity of an orbit typically is considered "highly elliptical" at an eccentricity of about 0.1. True anomaly may be the angle between the periapsis of an orbit and the current position of the orbiting body. The periapsis may be the point in the orbit where the orbiting body is closest to the central body.

According to aspects of one or more embodiments, an SSO may be a nearly polar orbit around a planet, in which the satellite may pass over any given point of the planet's surface at the same local mean solar time. Stated differently, it may be an orbit arranged so that the satellite may precess through one complete revolution each year, so as to maintain the same relationship with the Sun.

SSOs may include a particular configuration and are a function of the altitude of the object, where the mean RAAN drifts by about one degree per day. Accordingly, the SSO may include having the osculating orbital plane precess (rotate) approximately one degree eastward each day with respect to the celestial sphere to as match with the Earth's movement around the Sun. As a result, the satellite's orbital plane may rotate once a year, so as to keep the satellite in the same relative position with respect to the Sun.

The main advantages of SSOs may include: (1) Reduced solar glare: SSOs may be typically chosen so that the satellite may always be in sunlight, but the Sun may be at a low angle in the sky. This may reduce the amount of solar glare on the satellite's imaging sensors, which may improve the quality of the data collected. (2) Reduced thermal variations: SSOs may help to reduce the amount of thermal variation that the satellite experiences. Since the satellite 15 may always be in the same relative position with respect to the Sun, it may receive a consistent amount of sunlight so as to improve the performance of the satellite's instruments. Thus, SSOs may provide consistent lighting and thermal conditions, which may improve the quality and accuracy of the data collected as further described hereinbelow. (3) Enhance power management of the spacecraft from constant illumination of the solar panels.

Figure 2:
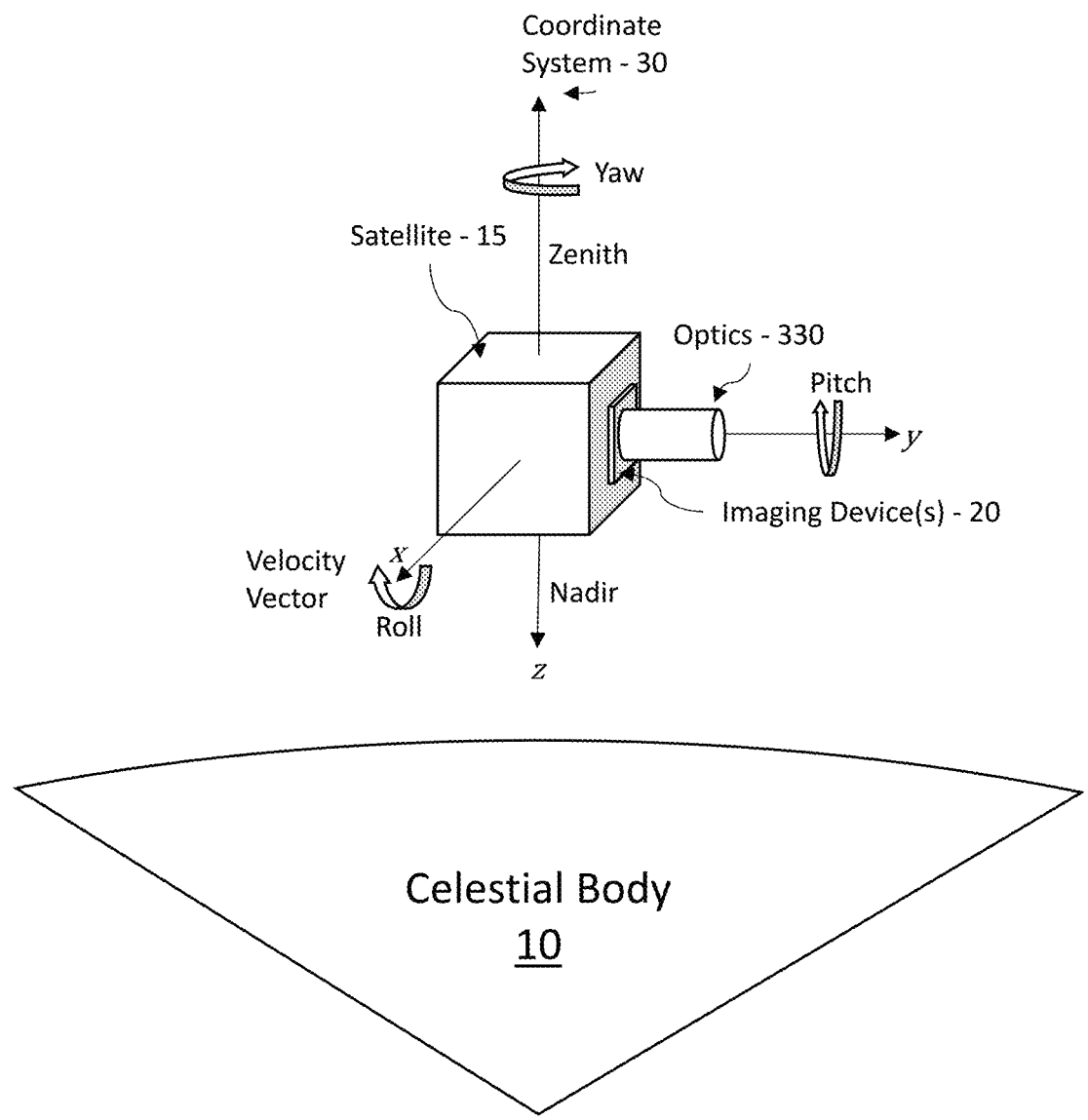
FIG. 2 depicts a schematic diagram of an exemplary spacecraft including characteristics to be simulated in accordance with one or more embodiments of the present disclosure.

FIG. 2 depicts a schematic diagram of an exemplary spacecraft including characteristics to be simulated in accordance with one or more embodiments of the present disclosure.

According to aspects of one or more embodiments, the satellite 15 may image RSOs with at least one imaging device 20 via optics 330 pointed towards a volume of space relative to a coordinate system 30. Which RSOs are imaged is dependent on the field of view (FOV) of the imaging device(s) 20 based on the velocity vector of the satellite 15, the pointing of the imaging device(s) 20 and optics 330, and the orbit properties of the RSO(s). Thus, simulation of the performance of the satellite 15 for detecting and imaging RSOs may be performed via simulation of such properties of the satellite 15 and the RSOs.

According to aspects of one or more embodiments, the satellite 15 may be orbiting around the celestial body 10 such as the Earth in an orbital plane. A Cartesian coordinate system 30 with orthogonal XYZ axes with an origin on a body of the satellite 15 (termed the "nadir"). The origin may be placed in any suitable position on the body of the satellite 15. The satellite 15 may move along the orbital plane travelling with any orbital velocity where the component of a tangential orbital velocity vector (TAN) (tangential to the orbital plane) may be coincident with the x axis, for example. In this coordinate scheme, the vector coincident with the optical axis of the imaging device 20 and optics 330 may form an angle a with the y-axis, an angle b with the x-axis, and an angle g with the z-axis. Stated differently, the optical axis of the imaging device 20 may be configured to image a portion of the sky pointing at any arbitrary angle relative to the origin on the body of the satellite 15 along the orbital plane.

According to aspects of one or more embodiments, the FOV 22 may be at a predefined orientation relative to a tangential component of the orbital velocity of the satellite 15. As the satellite 15 with at least one imaging device 20 moves along a given orbital plane, the field of view also moves along the orbital plane based on the orbital velocity of the satellite 15. The imaging device 20 may be configured to acquire images at predefined acquisition time intervals such as for example, but not limited to every 1 second. In this manner, each image may have a significant overlapping of features from the previous image where the overlapping coverage may be dependent on the orbital velocity and/or the predefined acquisition time intervals and/or the size of the FOV.

Note that the terms imaging device, imaging camera, and camera may be used interchangeably herein.

According to aspects of one or more embodiments, the satellite 15 may be orbiting around the celestial body 10 where the boresight of the imaging device 20 may be oriented so as to image the portion of the sky substantially in the direction of tangential orbital velocity vector (TAN) x such that a=90°, b=0°, and g=90°.

According to aspects of one or more embodiments, the satellite 15 may be orbiting around the celestial body 10 where the imaging device 20 may be side pointing so as to image the portion of the sky substantially perpendicular to the direction of tangential orbital velocity vector (TAN) x and opposite to the celestial body such that a=0°, b=90°, and g=90°.

Note that some embodiments are shown with the exemplary coordinate system 30 are merely for visual and conceptual clarity and not by way of limitation of the embodiments disclosed herein. The coordinate system 30 is merely used to illustrate that the optical axis of optics 330 (e.g., along the y axis of coordinate system 30) may image the portion of the sky in any arbitrary predefined direction relative to the direction of the orbital velocity of the satellite 15 and the origin on the body of the satellite 15. Any suitable coordinate system may be used. For example, different organizations and applications may use different coordinate systems, based on their specific needs. Some of the most common space coordinate systems used for describing the position and/or location of RSOs in space may include:

Earth-Centered Inertial (ECI) coordinate system: The ECI coordinate system is a non-rotating coordinate system that may be also centered on the Earth. It may be commonly used for spacecraft orbit determination and propagation. The ECI coordinate system may be defined by three coordinates: X, Y, and Z. The X-axis may point towards the vernal equinox, the Z-axis may point towards the North Pole, and the Y-axis complement the orthonormal frame. The ECI coordinate system may be used to describe the positions of RSOs relative to the Earth's center and the Sun.

According to aspects of one or more embodiments, the coordinate system may include orientations defined within an inertial frame. For example, the orientations may be used to locate objects in the sky and may be defined by two angles that form a polar representation of a line-of-sight towards the objects in the sky: right ascension (RA) and declination (Dec), which may also be known as RADEC. RA may be the angle measured eastward along the celestial equator from the vernal equinox to the object's hour circle, and Dec may be the angle measured north or south from the celestial equator to the object. The equatorial coordinate system may be a global coordinate system that may be used to locate objects anywhere in the sky. It may also be relatively easy to use since the RA and Dec coordinates (RADEC) of an object may be measured directly with a telescope or other astronomical instrument.

Geocentric coordinate system (GCS): The GCS is a global coordinate system that may use the Earth's center as its origin. It may be commonly used for navigation and tracking purposes. The GCS may be defined by three coordinates: latitude, longitude, and altitude. Latitude may be the angle measured north or south from the Earth's equator, longitude may be the angle measured east or west from the prime meridian, and altitude may be the distance above the Earth's surface. The GCS may be used to describe the positions of RSOs relative to the Earth's surface.

Topocentric coordinate system: The topocentric coordinate system is a local coordinate system that may use a specific point on the Earth's surface as its origin. It may be commonly used for tracking and targeting RSOs. The topocentric coordinate system may be defined by three coordinates: azimuth, elevation, and slant range. Azimuth may be the angle measured clockwise from north to the object, elevation may be the angle measured above the horizon, and slant range may be the distance between the observer and the object. The topocentric coordinate system may be used to describe the positions of RSOs relative to a specific ground station or other observer.

The embodiments of the present disclosure may use and/or reference the Equatorial coordinate system as will be further described hereinbelow. However, this is not by way of limitation of the embodiments disclosed herein. Any suitable coordinate system may be used to map and/or track RSOs in the sky.

According to aspects of one or more embodiments, embodiment shown uses the Celestial body 10 with the Earth's North pole as a reference for a celestial sphere surrounding the celestial body 10. The celestial sphere may include a celestial equator, a north celestial pole (NCP), and a south celestial pole (SCP). Declination (DEC) may be the distance (North/South) from the celestial equator that may be expressed in degrees. Similarly, right ascension (RA) may be the distance (East/West) from a Vernal Equinox that may be expressed in hours/minutes/seconds. The points of the celestial sphere may be used to describe a position of any celestial body in space. Coordinates of an exemplary RSO may be shown for visual clarity. Note that the orbital radius or a distance measurement from the celestial body 10 to the RSO may be further needed to characterize the orbital distance from the celestial body 10 and/or the satellite 15.

Figure 3:
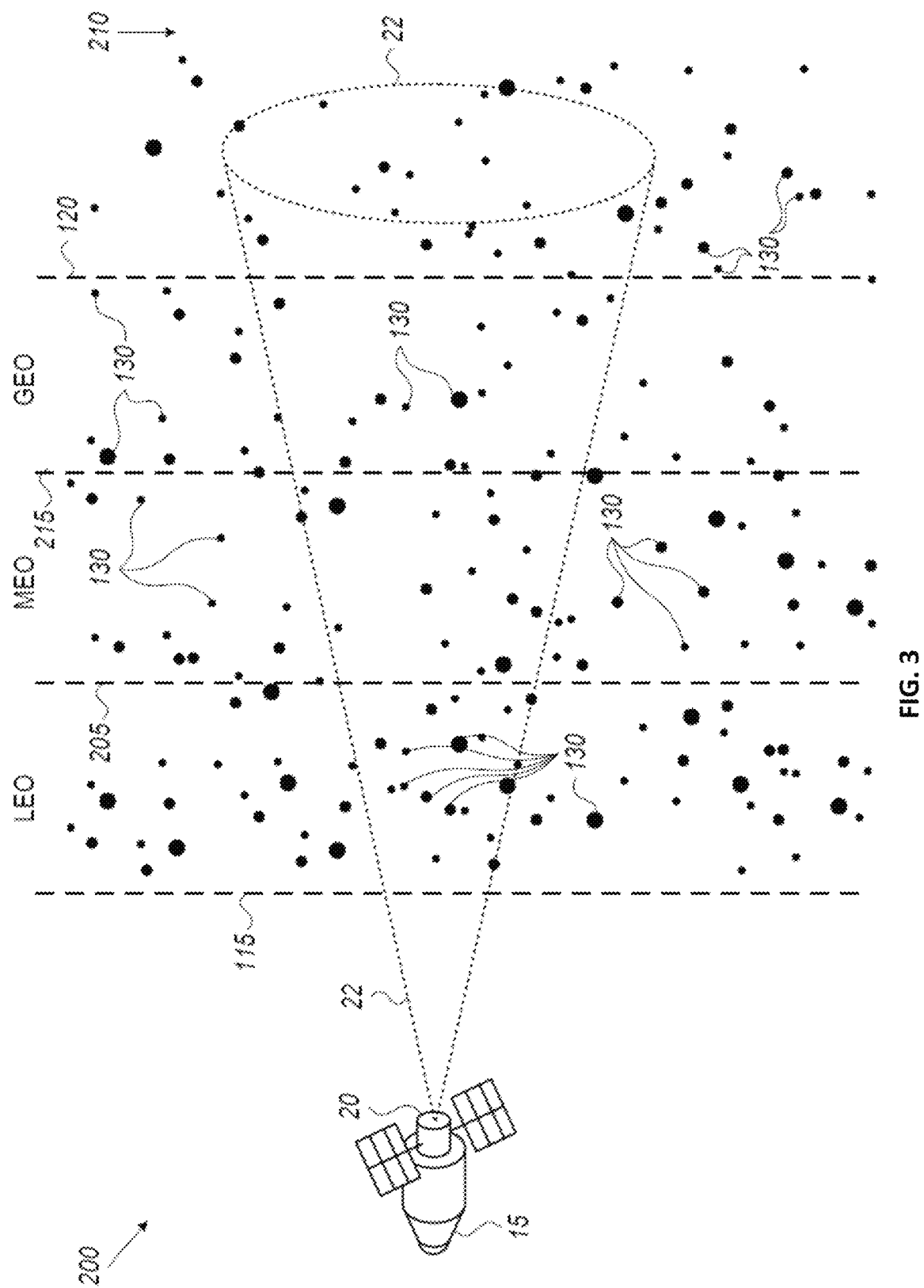
FIG. 3 depicts a schematic diagram of a satellite with an imaging device for which imaging a RSOs is simulated in accordance with one or more embodiments of the present disclosure.

FIG. 3 is a schematic diagram of an exemplary simulated space environment 200 including an exemplary simulated satellite 15 with the at least one imaging device 20 for imaging simulated RSOs 130 in accordance with one or more embodiments of the present disclosure. The at least one simulated imaging device 20 may image the simulated RSOs captured within the FOV 22 from the start of the LEO orbital region 115 distance from earth to the start of medium earth orbital region (MEO) 205 to the start of the GEO orbital region 215 to the end of GEO orbital region 120 to cislunar 210 distances from the celestial body 10. The at least one simulated imaging device 20 may include at least one imaging optical arrangement that focus the light captured from any of the simulated RSOs 130 in the FOV 22 onto sensors in the at least one simulated imaging device 20.

According to aspects of one or more embodiments, the simulated RSOs may orbit the Earth from a start of a low earth orbit (LEO) orbital region 115 at about 160 km above the earth to an end of geosynchronous (GEO) orbital region 120 or 35,786 km above the earth. Note that the simulated RSO 130 may be located within two concentric spheres of simulated RSOs bounded by the start of the LEO region 115 and the GEO distance 120. The simulated RSO 130 although shown as black dots may be, for example, simulated satellites 15 as shown in an enlarged inset 135.

Some of the simulated RSOs may be closer to the earth and less than LEO orbital region 115, and/or larger than GEO orbital region 120 (e.g., cislunar region outside of GEO orbital region). Note that cislunar may refer to any region between the earth and the orbit of the moon. Nevertheless, the at least one simulated imaging device 20 may capture any simulated RSOs entering the field of view (FOV) 22.

According to aspects of one or more embodiments, the FOV 22 of the at least one simulated imaging device 20 of an optical imaging system may be the angular extent of the observable world that may be seen at any given moment. The FOV may be described by the physical area which can be imaged, such as a horizontal or vertical field of view, e.g., in millimeters (mm) or other linear measurement, or alternatively, an angular field of view specified in degrees.

According to aspects of one or more embodiments, the FOV 22 of the optical imaging system may be determined by a number of factors, including but not limited to the focal length of one or more lenses of the optics 330, the size of the image sensor, and/or the aperture of the system. A lens with a shorter focal length may have a wider FOV than a lens with a longer focal length. A larger image sensor may also have a wider FOV than a smaller image sensor (see FIG. 4). A system with a larger aperture may have a wider FOV than a system with a smaller aperture.

According to aspects of one or more embodiments, the FOV 22 having an optical axis of the at least one simulated imaging device 20 may be configured to image celestial objects falling within the field of view 22 such as any of the simulated RSO 130 from a distance from the Earth ranging from the LEO orbital region 115 through GEO orbital region 120 into outer space.

According to aspects of one or more embodiments, the space situational awareness (SSA) simulated satellite optical payload (e.g., the at least one simulated imaging device 20) may have the optical axis of the FOV 22 configured to image a portion of the sky pointing at any arbitrary angle relative to the origin on the body of the simulated satellite 15 along the orbital plane. The FOV 22 may have, for example, a cone spanning, e.g., ±5, 10, 15, 20, 25, 30, 35 or more degrees, relative to the optical axis for performance optimization.

According to aspects of one or more embodiments, the simulated RSOs 130 in orbit about the celestial body 10 and illuminated by the sun in accordance with one or more embodiments of the present disclosure. Even though the FOV 22 of the at least one simulated imaging device 20 may be pointing to any of the simulated RSOs 130, an effective detection of these simulated RSOs 130 in the at least one simulated imaging device 20 is dependent on the interception of sunlight (e.g., rays of sunlight) that strikes a particular simulated RSO 130 and may be reflected into the FOV 22 of the at least one simulated imaging device 20. According to aspects of one or more embodiments, sunlight rays strike a simulated RSO 130 that reflects simulated light into the simulated optics 330 and simulated imaging device 20 of one of the simulated satellites 15. Similarly, the celestial body 10 may block sunlight rays from the sun from illuminating one or more of the simulated RSOs 130. Accordingly, even though a particular simulated RSO 130 may be simulated to be in a particular position in space (e.g., known particular right ascension and declination coordinates), if no light illuminates the particular simulated RSO 130 at the particular position (e.g., due to Earth shadowing), the presence of the particular simulated RSO 130 at the particular position may not be detectable by the at least one simulated imaging device 20.

According to aspects of one or more embodiments, the orbital planes may be sun-synchronous orbital planes.

According to aspects of one or more embodiments, a desired imaging coverage to determine the portion of the entire sky for imaging the known simulated RSOs 130 may be simulated based on a database of known simulated RSOs 130 that may be used to predict their expected location of each simulated RSO 130 in the sky at a given time. With this knowledge, simulated imaging devices 20 on a predetermined number of simulated satellites 15 on a predetermined number of orbital planes (e.g., a simulated satellite constellation) may be used to provide the desired imaging coverage to image the expected position of all known simulated RSOs 130 and to ignore other regions of the entire sky where there may be very few or no expected simulated RSOs 130. That is, the simulated satellite constellation may be configured to image a predetermined subset of the entire range of right ascension and declination values in space that may still cover the entire simulated RSO population and where, in this predetermined subset of the entire range of right ascension and declination values, every simulated RSO path is bound to cross the system's FOV 22 (e.g., at least one FOV 22).

Figure 4:
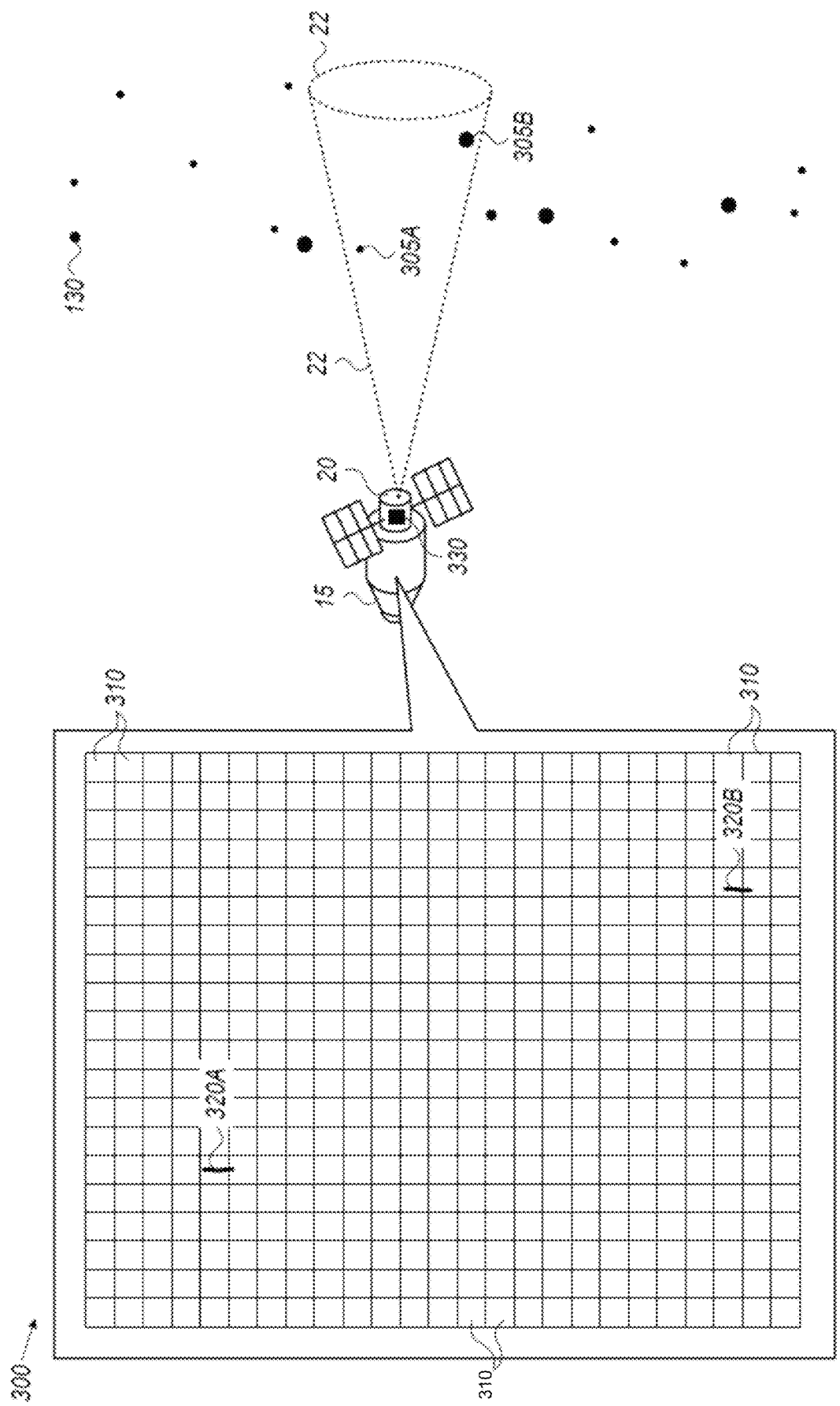
FIG. 4 depicts a schematic diagram of a sensors in an imaging device to be simulated in accordance with one or more embodiments of the present disclosure.

FIG. 4 is a schematic diagram of at least one simulated sensor array 300 of a simulated sensors 310 in the simulated imaging device 20 in accordance with one or more embodiments of the present disclosure. The simulated imaging device 20 may include simulated optics 330 that may further include but are not limited to optical lenses, optical filters, optical mirrors, polarizers, collimators, or any combination thereof. The simulated optics 330 may focus the image within the field of view onto a simulated sensor array in the simulated imaging device 20.

According to aspects of one or more embodiments, the simulated sensor array 300 may represent pixels by having the simulated sensors 310 arranged in a regular grid. Each simulated sensor 310 in the array 300 may be represented by a small square or rectangle (or any other shape) and may be responsible for detecting light from a specific point in the image. The brightness of each pixel in the image may be determined by the amount of light detected by the corresponding simulated sensor 310 in the simulated sensor array 300. The number of simulated sensors 310 in an array 300 may determine the resolution of the image so a higher resolution image may have more pixels to capture more detail.

According to aspects of one or more embodiments, the simulated sensors 310 may be configured to define pixels to detect light through the imaging optics and to generate image data of the image within the FOV 22. In the exemplary embodiment shown in FIG. 4, the simulated imaging device 20 may capture a simulated image of two celestial image features from the light reflected from two simulated RSOs denoted 305A and 305B in the FOV 22. The simulated optics 330 may be simulated to focus the reflected light from simulated RSOs 305A and 305B onto the simulated sensors 310. Since the simulated RSOs 305A and 305B may be moving with very high orbital velocities, the light captured by the imaging optics 330 may be spread over a number of pixels during the predefined image acquisition time (e.g., the frame-to-frame acquisition time). Note that simulated RSO 305A is closer to the simulated satellite 15 and thus, is simulated to travel faster through the FOV 22 than simulated RSO 305B, which, assuming matching orientation of velocity vectors, results in a simulated streak that is increased in length than simulated RSO 305B. However, the length of the simulated streak may also be simulated based on the orientation of the relative velocity vectors relative to the sensor boresight (e.g., where an object is moving directly towards or directly away from the sensor, the light will not be spread, with an angle between a velocity vector oriented directly towards the boresight and an orientation perpendicular to the boresight resulting in a corresponding change to the length of the streak). For example, the image of simulated RSO 305A may be detected as a streak 320A and simulated RSO 305B may be detected as a streak 320B, where, assuming a matching orientation of velocity vectors, results in streak 320A encompassing more pixels than streak 320B as shown on FIG. 4.

According to aspects of one or more embodiments, the angle of the streak on the simulated sensor array 300 may be indicative of the relative direction that the simulated RSO and/or the other celestial body may be moving within the FOV 22. Similarly, the length of the streak may be indicative of the velocity of the simulated RSO and/or the other celestial body moving within the FOV 22.

Note that the term streak may also be referred to as a streaklet.

According to aspects of one or more embodiments, simulated satellite optical imaging simulated sensors in simulated imaging device 20 for an optical simulated sensor array in a simulated satellite camera may include, for example, but are not limited to charge-coupled devices (CCDs) or complementary metal-oxide-semiconductor (CMOS) simulated sensors.

According to aspects of one or more embodiments, CCDs may be image simulated sensors may be simulated to use an array of photosensitive cells to convert light into electrical signals. CCDs may be known for their high sensitivity and image quality.

According to aspects of one or more embodiments, CMOS simulated sensors may be image simulated sensors that use an array of transistors to convert light into electrical signals. CMOS simulated sensors may be less expensive to manufacture than CCDs, but they may also be less sensitive and produce lower image quality.

According to aspects of one or more embodiments, the type of simulated sensor that may be used in a simulated satellite camera depends on the specific needs of the camera. For example, a simulated satellite camera that may need to collect high-resolution images of the Earth's surface may use a CCD simulated sensor. A simulated satellite camera that needs to be low-cost and lightweight may likely use a CMOS simulated sensor.

According to aspects of one or more embodiments, some examples of simulated satellite optical imaging simulated sensors for an optical simulated sensor array in a simulated satellite camera may include panchromatic simulated sensors, multispectral simulated sensors, and hyperspectral simulated sensors.

According to aspects of one or more embodiments, panchromatic simulated sensors may capture images in black and white. Panchromatic simulated sensors may typically be used for high-resolution imaging applications, such as mapping and surveillance.

According to aspects of one or more embodiments, multispectral simulated sensors may capture images in multiple wavelengths of light. Multispectral simulated sensors may typically be used for remote sensing applications, such as monitoring vegetation and land use.

According to aspects of one or more embodiments, hyperspectral simulated sensors may capture images in hundreds or even thousands of wavelengths of light. Hyperspectral simulated sensors may typically be used for scientific research applications, such as studying minerals and gases.

According to aspects of one or more embodiments, infrared simulated sensors may capture images in infrared wavelength ranges. For example, short wavelength infrared (SWIR) simulated sensors may operate in the 1.4-3 µm wavelength range. Mid-wavelength infrared (MWIR) simulated sensors may operate in the 3-8 µm wavelength range. Long wavelength infrared (LWIR) simulated sensors may operate in the 8-15 µm wavelength range.

According to aspects of one or more embodiments, the simulated sensors may detect light having a light intensity above a predefined detection threshold. The predefined detection threshold may depend on the type of simulated sensor used in the array.

Figure 5:
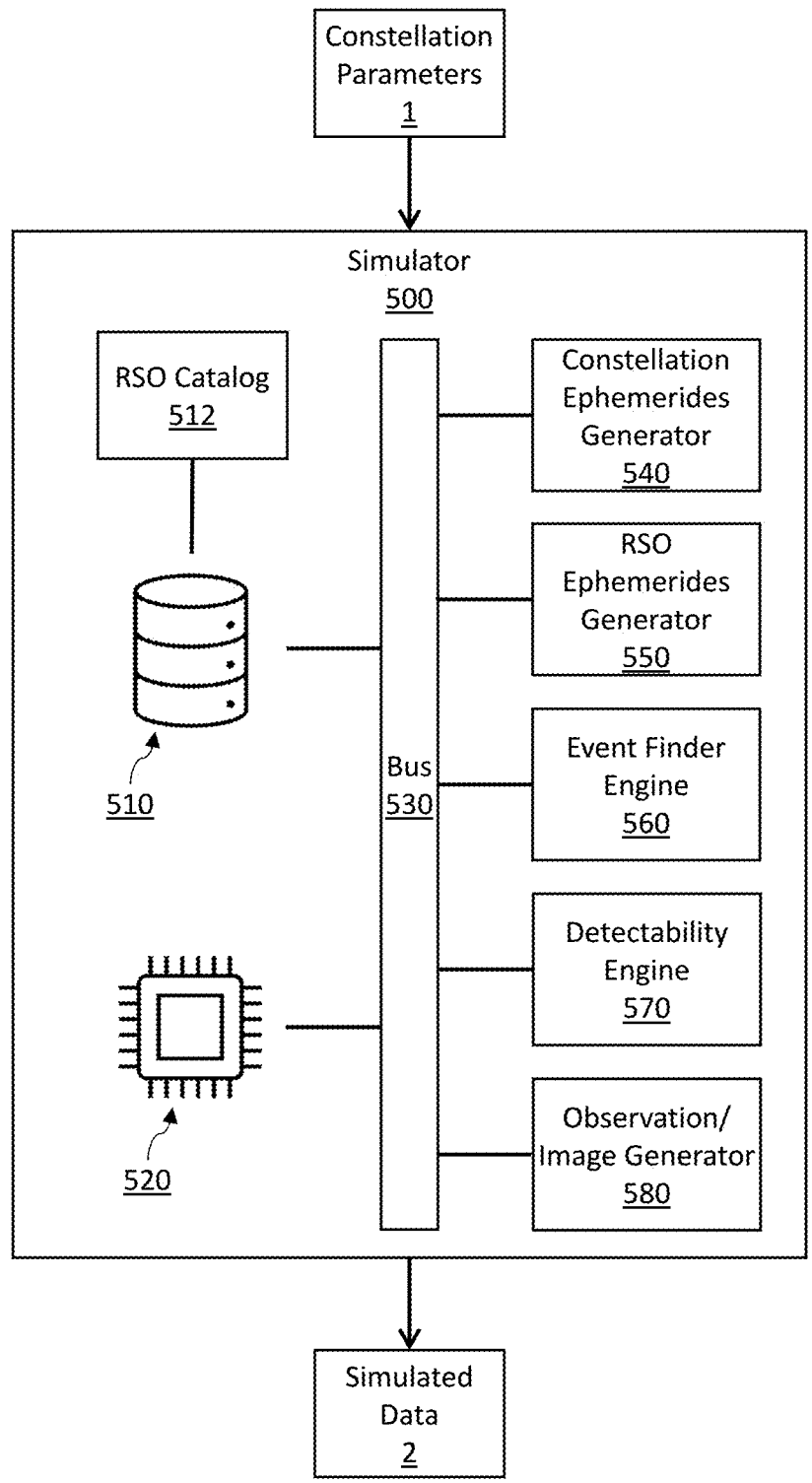
FIG. 5 depicts a schematic diagram of a computer-based simulator for simulation of space-based imaging of RSOs in accordance with one or more embodiments of the present disclosure.

FIG. 5 depicts a schematic diagram of a computer-based simulator 500 for simulation of space-based imaging of RSOs in accordance with one or more embodiments of the present disclosure.

According to aspects of one or more embodiments, satellites, such as satellites 15 detailed above, may be simulated using a simulator 500 to produce simulation results including, e.g., spice-kernels (e.g., frame/instrument kernels as defined in a sensor configuration, observer kernels including ephemerides and attitude, RSO kernels including ephemerides, etc.), geometric events, detectability revisit statistics (e.g., filter analyzed events, revisit summary for generic sizes, revisit summary for specific RSO size, etc.), signal-to-noise (SNR) stats (e.g., filtered events, summary statistics, etc.), observations, simulated images, among others or any combination thereof.

Herein, the term "event" refers to an appearance of a simulated RSO within a simulated FOV of the simulated satellite, irrespective of whether the appearance can be detected by the sensor of the satellite.

Herein, the term "observation" refers to an event that is observable by the sensor of the simulated satellite based on the sensor configuration, where "observable" means capable of detecting light simulated to be reflected by the RSO of the event.

Herein, the term "kernel" refers to ephemeris of the RSO for a step of propagation of ephemeris within an information system framework according to an orbit propagation technique, such as a numerical propagator. The information system may include Spacecraft, Planet, Instrument, C-matrix, Events (SPICE) maintained by the Navigation and Ancillary Information Facility (NAIF).

According to aspects of one or more embodiments, the kernel may include "SPICE" components or data, such as, e.g.:

a. S-Spacecraft ephemeris, given as a function of time.
b. P-Planet, satellite, comet, or asteroid ephemerides, or more generally, location of any target body, given as a function of time. According to aspects of one or more embodiments, the P component also includes certain physical, dynamical and cartographic constants for target bodies, such as size and shape specifications, and orientation of the spin axis and prime meridian.
c. I-Instrument information containing descriptive data peculiar to the geometric aspects of a particular scientific instrument, such as field-of-view size, shape and orientation parameters.

d. C-Orientation information, containing a transformation, traditionally called the "C-matrix," which provides time-tagged pointing (orientation) angles for a spacecraft bus or a spacecraft structure upon which science instruments are mounted. The C component may also include angular rate data for that structure.

e. E-Events information, summarizing mission activities-both planned and unanticipated. Events data are contained in the SPICE E-kernel file set, which consists of three components: Science Plans, Sequences, and Notes.

According to aspects of one or more embodiments, the simulator 500 may include hardware components such as a processor 520, which may include local or remote processing components. According to aspects of one or more embodiments, the processor 520 may include any type of data processing capacity, such as a hardware logic circuit, for example an application specific integrated circuit (ASIC) and a programmable logic, or such as a computing device, for example, a microcomputer or microcontroller that include a programmable microprocessor. According to aspects of one or more embodiments, the processor 520 may include data-processing capacity provided by the microprocessor. According to aspects of one or more embodiments, the microprocessor may include memory, processing, interface resources, controllers, and counters. According to aspects of one or more embodiments, the microprocessor may also include one or more programs stored in memory.

Similarly, the simulator 500 may include data store 510, such as one or more local and/or remote data storage solutions such as, e.g., local hard-drive, solid-state drive, flash drive, database or other local data storage solutions or any combination thereof, and/or remote data storage solutions such as a server, mainframe, database or cloud services, distributed database or other suitable data storage solutions or any combination thereof. According to aspects of one or more embodiments, the data store 510 may include, e.g., a suitable non-transient computer readable medium such as, e.g., random access memory (RAM), read only memory (ROM), one or more buffers and/or caches, among other memory devices or any combination thereof.

According to aspects of one or more embodiments, to produce the simulation data 2, constellation parameters 1 may be input to the simulator 500. The constellation parameters 1 may define characteristics and attributes of a simulated constellation including one or more simulated satellites having simulated payloads. According to aspects of one or more embodiments, the characteristics/attributes of the simulated constellation may include configuration parameters that define the orbital plane, orbital regime, attitude and other characteristics of each simulated satellite so as to define a test scenario for which performance of the constellation and/or each satellite is to be assessed. According to aspects of one or more embodiments, the characteristics/attributes of the simulated constellation may include configurations for each satellite in the constellation, including, e.g.: Semi-major axis (SMA), Eccentricity ECC, Inclination (INC), Right Ascencion of the Ascending Node RAAN, Argument of Perigee (ARGP), LM, Epoch, SSO plane, sensor yaw (AZ), sensor pitch/elevation (EL), sensor identifier, vehicle velocity, local horizontal (VVLH), instrument identifier, orbital plane configurations including RAAN, LTAN, S/C number, total number, LM, among others or any combination thereof.

Similarly, according to aspects of one or more embodiments, orbital propagation may be affected by the geometry of each satellite. Accordingly, the constellation parameters 1 may include a configuration for each satellite define the geometry of the satellite so as to establish values for calculating satellite orbit propagation. The geometry of each satellite may include parameters, such as, mass (e.g., in kg or other mass unit), length in x (e.g., in meters (m) or other linear unit), length in y (e.g., in m or other linear unit), length in z (e.g., in m or other linear unit), solar array area (e.g., in m^2 or other linear unit), drag coefficient, absorption coefficient, among others or any combination thereof. According to aspects of one or more embodiments, reflectivity of the satellite may also affect the operation of a sensor onboard the satellite due to the light reflected from the spacecraft reaching the sensor. Thus, the geometry parameters may also include, e.g., a reflection coefficient, among others or any combination thereof.

According to aspects of one or more embodiments, the detection of light from RSOs depends on the image sensor and the characteristics thereof. Indeed, the optics and sensor characteristics affect how the sensitivity of the sensor, the focus of the signal, the shape and/or intensity of the detected signal, the location in an image of the detected signal, among other aspects of the detection of a light signal indicative of light reflected by an RSO. Accordingly, According to aspects of one or more embodiments, the parameters defining the simulated image sensor may include, e.g., sun exclusion, effective aperture, exposure time, number of pixels along x, number of pixels along y, FOV in x, FOV in y, pixel dimension along x, pixel dimension along y, individual pixel FOV ("I-FOV") in x, I-FOV in y, dark current, readout, transmittance, electron well, bits encoding of the sensor, focal length of the optics, quantum efficiency (QE) of the sensor (in U, B, V, R and I), point spread function (PSF) Area, PSF energy, background magnitude, among others or any combination thereof. According to aspects of one or more embodiments, QE may be defined according to one or more datasets, functions, plots or other data representing as-tested quantum efficiency as a function of wavelength for a sensor type of the sensor, e.g., which may be references using a sensor identifier (e.g., serial number, model name, etc.).

According to aspects of one or more embodiments, to identify the events, the orbital trajectory of both the simulated satellites and the simulated RSOs may be simulated. Such calculation is based on parameters of the orbit and geometry of each satellite and each RSO. Thus, as detailed above, the calculation of the orbital trajectory of each satellite may also be performed based on satellite orbit parameters and satellite geometry parameters so as to enable propagation of orbit states across a number of kernels. Similarly, the calculation of the orbital trajectory of each RSO may also be performed based on RSO orbit parameters and RSO geometry parameters so as to enable propagation of orbit states across a number of kernels. According to aspects of one or more embodiments, the RSO orbit parameters may include, e.g., SMA, ECC, inclination, RAAN, ARGP, LM, epoch, SSO Plane (e.g., in degrees or radians), AZ, EL, VVLH, among others or any combination thereof. According to aspects of one or more embodiments, the RSO geometry parameters may include, e.g., mass (e.g., in kg or other unit of mass), length in x (e.g., in m or other linear unit), length in y (e.g., in m or other linear unit), length in z (e.g., in m or other linear unit), solar array area (e.g., in m^2 or other linear unit), drag coefficient, absorption coefficient, reflection coefficient, among others or any combination thereof.

According to aspects of one or more embodiments, the simulator 500 may configure a simulation of a satellite constellation and RSOs based on the constellation parameters 1 to simulate the orbital trajectories of the satellites and RSOs, the reflectivity of the RSOs and the detection of light reflections due to the reflectivity by the sensor of each satellite. To do so, the simulator 500 may utilize computer engines for generating various components of the simulation. In particular, the simulator 500 may include, e.g., a constellation ephemerides generator 540 for generating simulated ephemerides of each satellite based on the satellite orbits and/or geometries of the constellation parameters 1, am RSO ephemerides generator 550 for generating simulated ephemerides of each RSO based on the RSO orbits and/or geometries of the constellation parameters 1, an event finder engine 560 for identify events in which the simulated RSOs cross in front of the FOV of a simulated satellite, a detectability engine 570 for determining characteristics of light simulated to be received by a sensor based on satellite and RSO geometries, straylight, albedo modelling among other factors to determine whether a sensor would be able to detect each event based on the sensor parameters, and an observation image generator 580 for simulating the output of the sensor of each satellite based on the sensor parameters, characteristics of the detectable events, and background imagery.

According to aspects of one or more embodiments, the terms "computer engine" and "engine" identify at least one software component and/or a combination of at least one software component and at least one hardware component which are designed/programmed/configured to manage/control other software and/or hardware components (such as the libraries, software development kits (SDKs), objects, etc.).

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. According to aspects of one or more embodiments, the one or more processors may be implemented as a Complex Instruction Set Computer (CISC) or Reduced Instruction Set Computer (RISC) processors; x86 instruction set compatible processors, multi-core, or any other microprocessor or central processing unit (CPU). In various implementations, the one or more processors may be dual-core processor(s), dual-core mobile processor(s), and so forth.

Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

According to aspects of one or more embodiments, each of the constellation ephemerides generator 540, the RSO ephemerides generator 550, the event finder engine 560, the detectability engine 570 and/or the observation/image generator 580 may include dedicated and/or shared software components, hardware components, or a combination thereof. For example, each of the constellation ephemerides generator 540, the RSO ephemerides generator 550, the event finder engine 560, the detectability engine 570 and/or the observation/image generator 580 may include a dedicated processor and storage. However, According to aspects of one or more embodiments, each of the constellation ephemerides generator 540, the RSO ephemerides generator 550, the event finder engine 560, the detectability engine 570 and/or the observation/image generator 580 may share hardware resources, such as the processor 520 and data store 510 of the simulator 500 via, e.g., a bus 530.

Figure 6:
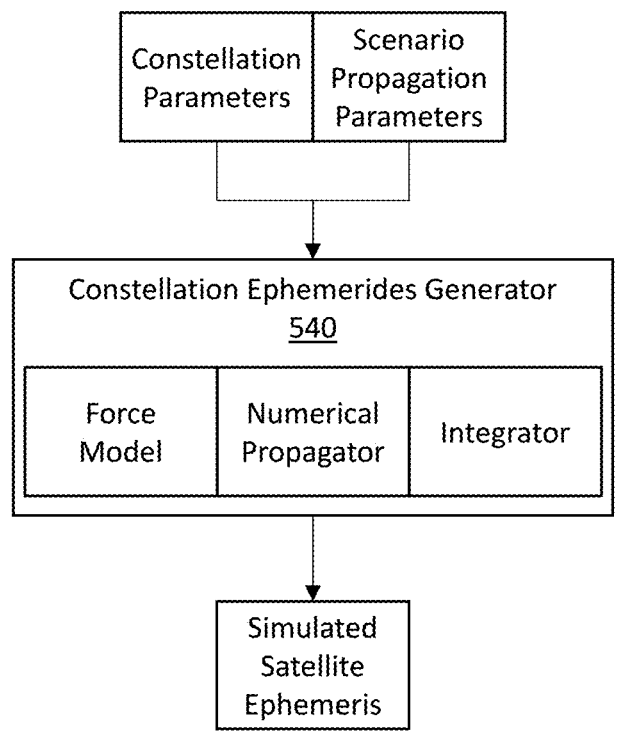
FIG. 6 depicts a schematic diagram of a constellation ephemerides generator of the exemplary computer-based simulator for simulation of space-based imaging of RSOs in accordance with one or more embodiments of the present disclosure.

According to aspects of one or more embodiments, the constellation ephemerides generator 540 may simulate a propagation of state vectors across a simulation period of time for one or more simulated satellites so as to simulate ephemerides characterizing the orbital trajectory of each satellite of the simulated satellite(s) (e.g., as depicted is further detail in FIG. 6). According to aspects of one or more embodiments, the constellation ephemerides generator 540 may employ one or more numerical and/or analytical techniques to propagate the state vectors of each simulated satellite based on the satellite configuration data in the constellation parameters 1.

According to aspects of one or more embodiments, a numerical propagation is describe herein as an illustrative example, though other forms of propagation may be used, such as, e.g., Keplerian or Eckstein-Hechler, Newton's method, conic orbits, patch conic approximation, universal variable formulation, perturbations, or other propagation determination technique or any combination thereof. According to aspects of one or more embodiments, the numerical propagation may be more accurate than analytical propagation but may employ more steps to set up to be used properly. Whereas analytical propagators are configured only thanks to their various constructors and can be used immediately after construction, numerical propagators configuration involve setting several parameters between construction time and propagation time.

According to aspects of one or more embodiments, the numerical propagator may include a numerical integrator which is configured to solve differential equations. The numerical integrator may be employed for mathematical problems where an analytical solution does not exist. According to aspects of one or more embodiments, the differential equation is problem specific. In embodiments of the present disclosure, the numerical propagator may solve the differential equation(s) for RSO simulation using a variety of forces (terms in the differential equations of motion for an RSO), that makes the equations not resolvable analytically, thus benefiting from the use of the numerical propagator, including the numerical integrator. These forces are modelled and represents, for instance, precise gravitational force of the Earth, atmospheric drag, solar radiation pressure, Moon and Sun gravitation perturbations. According to aspects of one or more embodiments, the numerical propagator may employ one or more additional terms, such as terms associated with relatively smaller perturbations. According to aspects of one or more embodiments, multiple models may be used for each of these perturbations that then impact the differential equation.

According to aspects of one or more embodiments, whether numerical or analytical propagator, to enable accurate simulation of ephemerides, the constellation parameters 1 may include configurations parameters for each satellite that would be used for orbit propagation for an in-flight satellite. For example, configuration parameters for the propagation may include, e.g., an initial spacecraft state, a central attraction coefficient, one or more force models, a type of orbital parameters to be used for propagation, a type of position angle to be used in orbital parameters to be used for propagation where it is relevant, whether state transition matrices and Jacobians matrices should be propagated along with orbital al state, whether additional derivatives should be propagated along with orbital state, discrete events that should be triggered during propagation, a binding logic with the rest of the application, among others or any combination thereof.

According to aspects of one or more embodiments, the initial spacecraft state may be defined in the constellation parameters 1, including, e.g., orbit parameters and/or satellite physical characteristics (e.g., mass and/or geometry). According to aspects of one or more embodiments, the orbit parameters may include, e.g., equinoctial orbit parameters (a, ex, ey, hx, hy, λM or λE or Av) in meters and radians, Keplerian orbit parameters (a, e, i, ω, Ω, M or E or v) in meters and radians, circular orbit parameters (a, ex, ey, i, Ω, αM or αE or αv) in meters and radians, and/or Cartesian orbit parameters (x, y, z, vx, vy, vz) in meters and meters per seconds. According to aspects of one or more embodiments, default propagation settings may utilize in equinoctial parameters with a true longitude argument. According to aspects of one or more embodiments, where the constellation parameters 1 do not explicitly specify the central attraction coefficient, the one used to define the initial orbit may be used.

According to aspects of one or more embodiments, constellation parameters 1 may include custom attitude adjustments to, for example, simulate satellite maneuvers. Thus, for each step in the propagation, the propagator may check the custom attitudes for each satellite to determine whether to shift or modify the current and/or next step of propagation, e.g., by changing a state vector to reflect a change in attitude specified in the custom attitudes. As a result, each step in the simulation may be follow from the change in attitude so as to simulate a maneuver by one or more satellites of the simulated constellation.

According to aspects of one or more embodiments, the propagator may include an underlying numerical integrator, set up in the constructor which may also have its own configuration parameters. According to aspects of one or more embodiments, configuration parameters for adaptive step-size integrators may include a minimum, maximum, a start step size, one or more absolute and/or relative errors thresholds, among others or any combination thereof.

Thus, according to aspects of one or more embodiments, the constellation parameters 1 may establish the input parameters for the propagator for each simulated satellite in the simulated constellation. Based on the configuration of each simulated satellite, the propagator may output a series of state vectors to generate the ephemerides for the simulation period. According to aspects of one or more embodiments, the number of state vectors may depend on the step-size and the length of time of the simulation period. Alternatively, or additionally, the simulation period may be defined by a number of state vectors to output, and thus may have a length that depends on the step-size and the number of state vectors. According to aspects of one or more embodiments, each state vector may correspond to an observer kernel of the simulation period.

According to aspects of one or more embodiments, concurrently or serially with the constellation ephemerides generator 540, the RSO ephemerides generator 550 may generate ephemerides for each RSO by propagation state vectors for RSO in an RSO catalog 512. According to aspects of one or more embodiments, the RSO catalog 512 may include state vectors and/or two-line elements (TLE) for a set of known RSO's. The RSO catalog 512 may be used by a variety of organizations, including space agencies, military agencies, satellite operators, and researchers. Space agencies may use RSO repositories to track the movement of RSOs and to assess the risk of collisions. Satellite operators may use RSO repositories to avoid collisions with other satellites. Researchers may use RSO repositories to study the population of RSOs and to develop ways to mitigate the risks posed by RSOs.

Thus, according to aspects of one or more embodiments, the RSO catalog 512 may include a locally and/or externally sourced repository of RSO's, such as, e.g., North American Aerospace Defense Command (NORAD), Northstar Earth & Space, space-track.org, L3Harris, or other situational space awareness (SSA) supplier or any combination thereof. According to aspects of one or more embodiments, the RSO catalog 512 may be a synthetic dataset of programmatically, manually, and/or machine learning (ML) generated RSOs, or any combination thereof.

According to aspects of one or more embodiments, the RSO ephemerides generator 550 may query the data store 510 to access the RSO catalog 512 and load the RSOs for orbit propagation. According to aspects of one or more embodiments, similar to the constellation ephemerides generator 540, the RSO ephemerides generator 550 may employ one or more numerical and/or analytical techniques to propagate the state vectors of each simulated satellite based on the satellite configuration data in parameters of each RSO, including, e.g., the respective TLE/state vectors, and/or RSO mass and/or geometry, among other parameters or any combination thereof (e.g., as depicted is further detail in FIG. 7).

According to aspects of one or more embodiments, to enable accurate simulation of ephemerides, the RSO data of the RSO catalog 512 may include RSO parameters for each RSO. For example, RSO parameters for the propagation may include, e.g., an initial RSO state, a central attraction coefficient, one or more force models, a type of orbital parameters to be used for propagation, a type of position angle to be used in orbital parameters to be used for propagation where it is relevant, whether state transition matrices and Jacobians matrices should be propagated along with orbital state, whether additional derivatives should be propagated along with orbital state, discrete events that should be triggered during propagation, a binding logic with the rest of the application, among others or any combination thereof.

According to aspects of one or more embodiments, the initial RSO state may be defined in the RSO parameters, including, e.g., orbit parameters and/or RSO physical characteristics (e.g., mass and/or geometry). According to aspects of one or more embodiments, the orbit parameters may include, e.g., equinoctial orbit parameters in meters and radians, Keplerian orbit parameters in meters and radians, circular orbit parameters in meters and radians, and/or Cartesian orbit parameters in meters and meters per seconds. According to aspects of one or more embodiments, default propagation settings may utilize in equinoctial parameters with a true longitude argument. According to aspects of one or more embodiments, where the RSO parameters do not explicitly specify the central attraction coefficient, the one used to define the initial orbit may be used.

According to aspects of one or more embodiments, RSO parameters may include custom maneuvers and deviations from initial condition to, for example, simulate RSO maneuvers, collisions and/or other changes of trajectory. Thus, for each step in the propagation, the propagator may check the custom maneuvers and deviations for each RSO to determine whether to shift or modify the current and/or next step of propagation, e.g., by changing a state vector to reflect a change in attitude specified in the custom maneuvers and deviations. As a result, each step in the simulation may be follow from the change in attitude so as to simulate a maneuver by one or more RSOs.

According to aspects of one or more embodiments, the propagator may include an underlying numerical integrator, set up in the constructor which may also have its own configuration parameters. According to aspects of one or more embodiments, configuration parameters for adaptive step-size integrators may include a minimum, maximum, a start step size, one or more absolute and/or relative errors thresholds, among others or any combination thereof.

Thus, according to aspects of one or more embodiments, the RSO catalog and RSO parameters may establish the input parameters for the propagator for each simulated RSO. Based on the configuration of each simulated RSP, the propagator may output a series of state vectors to generate the ephemerides for the simulation period. According to aspects of one or more embodiments, the simulation period for the RSOs may align with the simulation period for the constellation so as simulate behavior of the RSOs and satellites during a common period of time.

According to aspects of one or more embodiments, the number of state vectors may depend on the step-size and the length of time of the simulation period. Alternatively, or additionally, the simulation period may be defined by a number of state vectors to output, and thus may have a length that depends on the step-size and the number of state vectors. According to aspects of one or more embodiments, each state vector may correspond to a RSO kernel of the simulation period.

Figure 8:
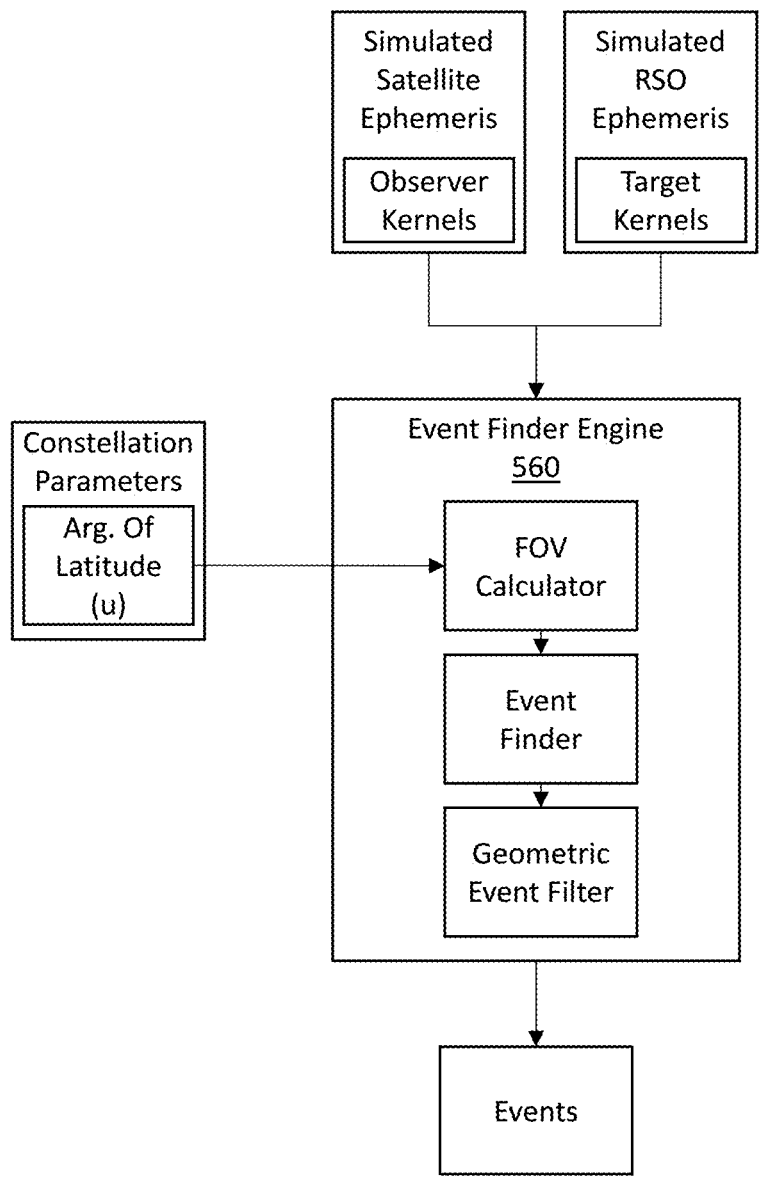
FIG. 8 depicts a schematic diagram of an event finder engine of the exemplary computer-based simulator for simulation of space-based imaging of RSOs in accordance with one or more embodiments of the present disclosure.

According to aspects of one or more embodiments, upon simulating the behavior of each satellite and each RSO, the simulator 500 may implement an event finder engine 560 to perform event finding, where an event includes an RSO passing through the field of view a sensor of a simulated satellite of the simulated constellation (e.g., as depicted is further detail in FIG. 8). Thus, the event finder engine 560 may synchronize the observer kernels and the RSO kernels in time based on the step-size and simulated time period.

According to aspects of one or more embodiments, the event finder engine 560 may determine for each observer kernel for each satellite, an imaging device pointing definition, e.g., based on configuration pointing definitions of a sensor configuration. According to aspects of one or more embodiments, the configuration pointing definitions may include, e.g., an orientation of the imaging device of each simulated satellite with respect to a body of each simulated satellite, an orientation of the imaging device of each simulated satellite with respect to the velocity vector and/or nadir of each simulated satellite, or other definition of the pointing of the imaging device.

According to aspects of one or more embodiments, based on the ephemerides, the pointing definition for each satellite, and sensor and/or optics configurations of each satellite, the field of view of each imaging device of each satellite may be determined. According to aspects of one or more embodiments, the sensor and/or optics configurations of each satellite may, as detailed above, include, e.g., sun exclusion, effective aperture, exposure time, number of pixels along x, number of pixels along y, FOV in x, FOV in y, pixel dimension along x, pixel dimension along y, I-FOV in x, I-FOV in y, dark current, readout, transmittance, electron well, bits encoding of the sensor, focal length of the optics, QE, PSF Area, PSF energy, background magnitude, among others or any combination thereof. Thus, according to aspects of one or more embodiments, the FOV, I-FOV and focal length of the optics together with the orientation and ephemerides of each satellite may be used to determine the field of view of the imaging device of each satellite.

Accordingly, the field of view of each satellite may be projected into a volume of space (see, e.g., FIG. 3 and FIG. 4 detailed above). Because the ephemerides of each RSO have also been simulated, the regions of space through with each RSO is simulated to traverses is also known. Accordingly, the event finder engine 560 can determine the intersection between the field of view of the image sensor of each satellite and the volume of space through with one or more RSOs are simulated to traverse. As a result, the event finder engine 560 may identify observer and/or RSO kernels for which there is an intersection between the field of view of a particular satellite and one or more particular RSOs, and because I-FOV is configured, the individual pixel(s) of the imaging device of the particular satellite on which one or more RSOs may be captured. As a result, the event finding engine 560 may produce a set of candidate events during which a simulated RSO traverses a volume of space within a simulated satellite's field of view.

According to aspects of one or more embodiments, the event finding engine 560 may produce a set of events for which an RSO is in view of a satellite, but it is possible that not all events are capable of being imaged by the imaging device of the satellite(s). Accordingly, the simulator 500 may employ a detectability engine 570 to assess the detectability of each event by the sensor of each simulated satellite based at least in part on the sensor configuration and one or more detectability parameters for one or more detectability models (e.g., as depicted is further detail in FIG. 9).

According to aspects of one or more embodiments, the detectability engine 570 may simulate the light reflected by each RSO based on the position and geometry of each RSO, as well as other light such as straylight, Earth albedo, star background, cosmic rays, among other signals that the sensor of a simulated satellite may be expected to detect. Based on the light from the RSOs and the other sources of light, the detectability engine 570 may determine whether the sensor of the simulated satellite is capable of detected a signal for the light of the RSO.

According to aspects of one or more embodiments, the capability of detection depends on the characteristics of the sensor being used. Accordingly, the detectability engine 570 may also employ the sensor parameters from the constellation parameters 1, such as pixel size, PSF-related parameters, QE, among others or any combination thereof. Thus, the detectability engine 570 simulate the ability of the sensor to distinguish the light from the RSO from noise such as the other sources of light and/or static produced by the sensor itself.

Figure 9:
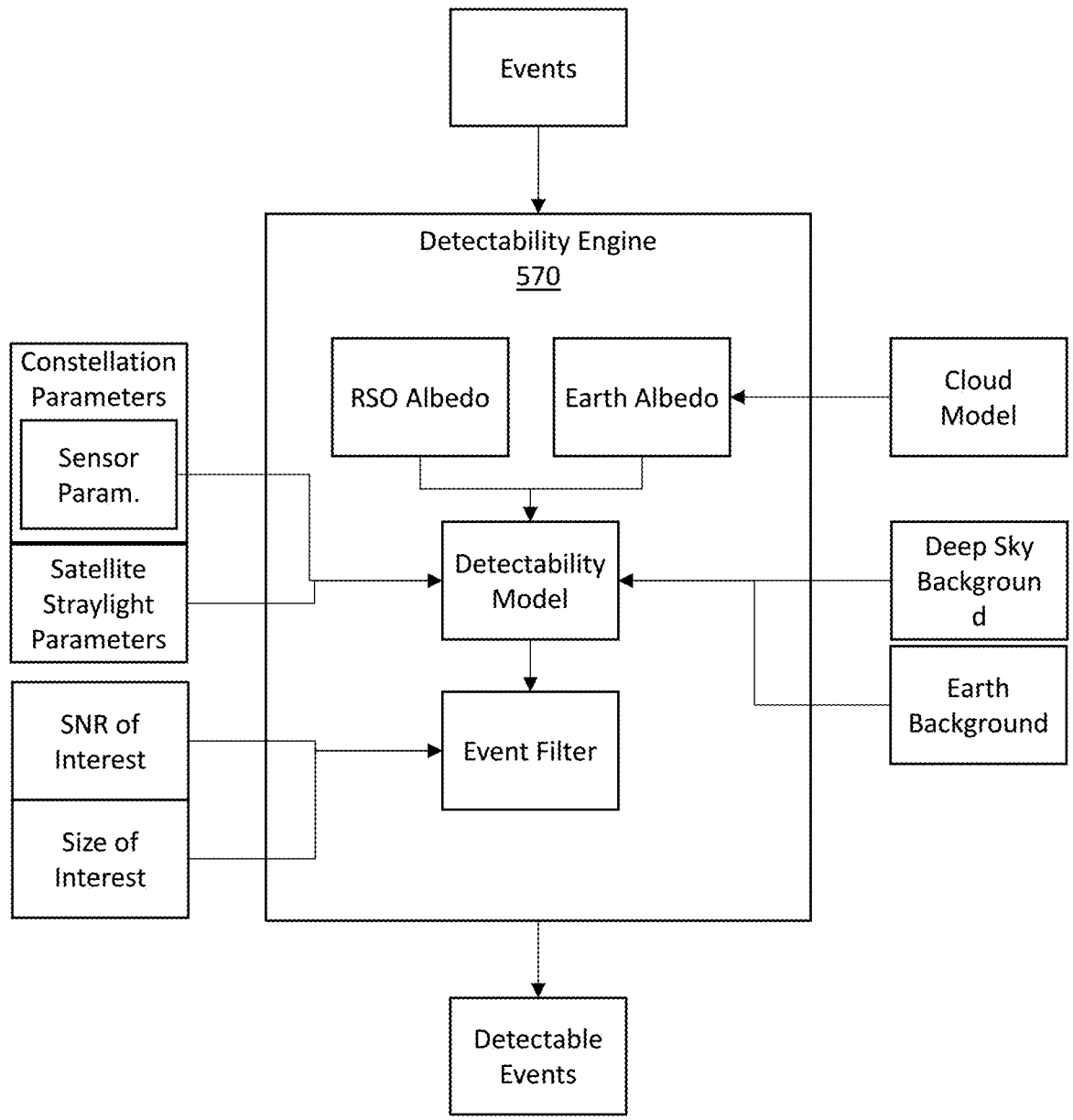
FIG. 9 depicts a schematic diagram of a detectability engine of the exemplary computer-based simulator for simulation of space-based imaging of RSOs in accordance with one or more embodiments of the present disclosure.

According to aspects of one or more embodiments, to determine the magnitude of the signal detected by the various sources of light, the detectability engine 570 may employ a photometry model, albedo model and/or straylight model, e.g., as depicted in FIG. 9. According to aspects of one or more embodiments, parameters and input values for the detectability models may be established in a configuration file and/or in the constellation parameters 1. According to aspects of one or more embodiments, such parameters and/or input values may include, e.g., at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs, among others or any combination thereof.

According to aspects of one or more embodiments, based on the parameters and/or input values, the detectability engine 570 may employ the photometry model to simulate a signal representing a sensor output resulting from the subset of RSO kernels being in the FOV of the simulated satellite based on the sensor configuration and the events determined by the event finder engine 560. According to aspects of one or more embodiments, the photometry model may also simulate a noise representing a sensor output resulting from at least one background definition, at least one straylight model and at least one slew correction based at least in part on the at least one sensor configuration.

According to aspects of one or more embodiments, whether signal is adequately distinguished from the noise so as to enable RSO detection is based on the ratio of the signal to noise (SNR). According to aspects of one or more embodiments, a threshold of the SNR sufficient for detection may be dependent on sensor configuration and/or tolerance for inaccuracy in resulting calculations such as object detection, orbit determination, state propagation, etc. Accordingly, the threshold SNR may be configured via the configuration file and/or constellation parameters 1. Similarly, other parameters may be set in the configuration file and/or constellation parameters 1, such as:
 a. Sensor selection,
 b. SUN and/or VEGA photometry model,
 c. RSOs category definition for statistics computation,
 d. background definition,
 e. straylight definition and correction (TAS),
 f. slew correction (e.g., the custom attitude file), and/or
 g. SNR and/or RSO size of interest thresholds.

According to aspects of one or more embodiments, the detectability-model of the detectability engine 570 may include an algorithm that takes geometrical access-events and process them to only keep actual detected events. In some embodiments, the detectability model may include sub-models for determining the intensity and/or magnitude of light from a simulated RSO, as well as the simulated sensor's perception of the light via one or more photometry model(s).

According to aspects of one or more embodiments, the algorithm may take into account the following effects/phenomenon:
 a. Earth umbra/penumbra using a spherical Earth model,
 b. Sun exclusion angle, and
 c. Relative velocity of the target with respect to the rotating satellite observer.

According to aspects of one or more embodiments, the RSO may be modelled with a homogeneous Lambertian model, and the magnitude considered are based on a calibrated zero-point model, though as detailed above, other modelling techniques may be employed.

According to aspects of one or more embodiments, the detectability-model may include analyzing the geometrical access to check whether the boresight is out of the Sun-Exclusion cone. According to aspects of one or more embodiments, the Sun-Exclusion cone may be characterized by a configuration parameter defining the full cone angle, such as, e.g., 35°, 40°, 45°, 50°, 55°, 60°, 65° or other full cone angle.

According to aspects of one or more embodiments, the Sun Exclusion angle $\theta_{sun\_Excl}$ may be described by the circular cone with the satellite-observer as the center and the boresight as the cone-axis where the Sun's light could potentially damage the instrument, and therefore must not be pointed in that direction. Accordingly, a first criteria for visibility may include where the angle between: a unit vector associated with the boresight, and a unit vector associated with the sun, exceeds half the sun exclusion angle. For example, the first criteria may include:

$$\theta = \cos^{-1}(\overrightarrow{\text{Boresight}}, \overrightarrow{\text{Sun}}) > \frac{\theta_{Sun\_excl}}{2}$$

According to aspects of one or more embodiments, the angle is computed within the sensor frame where Boresight is aligned with Z (0, 0, 1). According to aspects of one or more embodiments, the Sun vector may be computed from its J2000 coordinates converted into the sensor-frame using the appropriate quaternions at the event date provided in the geometrical-access data.

Intensity Model of the Detectability Model

According to aspects of one or more embodiments, the detectability model may simulate sun intensity on each RSO. According to aspects of one or more embodiments, Sun intensity may be a value between 0 and 1, inclusive ("[0, 1]") (no unit), that varies based on the position of the RSO with respect to the Earth Umbra/Penumbra. The intensity value is 1 if the RSO can fully see the Sun disk and 0 if it is within the Earth Umbra cone. Within the Earth penumbra, the value is between 0 and 1, exclusive ("]0, 1["]. According to aspects of one or more embodiments, the significance of presence in the penumbra is low for LEO objects as LEO objects are in the penumbra for seconds per period, and increases for GEO objects as GEO objects are in the penumbra for a period on the order of minutes. Thus, the intensity value may be determined based on the orbit of the RSO and the position of the RSO relative to the boresight and the Sun angle.

To illustrate determining an intensity value of an RSO, an example algorithm may include as follows:

According to aspects of one or more embodiments, the center of the J2000 frame is assumed to be the center $O_E$ of the spherical Earth with a radius of 6378 km. Additionally, the following variables may be defined: $D_{sun}$: Distance of the center of the Sun, $R_{sun}$: Sun radius (695510 km), $R_{eq}$: Earth Equatorial Radius (6378 km), $D_{Umbra}$, the distance from OE to the center of the Umbra cone may be defined as:

$$D_{umbra} = \frac{R_{eq} D_{Sun}}{R_{Sun} - R_{eq}}$$

According to aspects of one or more embodiments, @Umbra, the umbra cone half-angle may be given by:

$$\alpha_{Umbra} = \tan^{-1}\left(\frac{R_{eq}}{D_{Umbra}}\right)$$

According to aspects of one or more embodiments, the projection of the RSO on the Solar unit vector $\vec{\text{Proj}}_{RSO}$ may be determined according to:

$$\vec{\text{Proj}}_{JRSO} = (\vec{RSO} \cdot \vec{\text{Sun}}_{unit}) \vec{\text{Sun}}_{Unit}$$

According to aspects of one or more embodiments, the RSO may be in the umbra if the dot product is negative and if:

$$H_{RSO} = \|\vec{RSO} - \vec{\text{Proj}}_{JRSO}\| \leq \tan(\alpha_{Umbra})(D_{Umbra} - \|\vec{\text{Proj}}_{JRSO}\|)$$

In that case the Sun intensity is 0.

Alternatively, or additionally, according to aspects of one or more embodiments, the penumbra can be define with:

$$D_{penumbra} = \frac{R_{eq} D_{Sun}}{R_{Sun} + R_{eq}}, \; \alpha_{Umbra} = \tan^{-1}\left(\frac{R_{eq}}{D_{Penumbra}}\right)$$

According to aspects of one or more embodiments, the criteria to be in the penumbra may then be:

$$H_{RSO} = \|\vec{RSO} - \vec{\text{Proj}}_{JRSO}\| \leq \tan(\alpha_{Penumbra})(D_{Penumbra} + \|\vec{\text{Proj}}_{JRSO}\|)$$

$R_a$ may be defined as the radius of the Sun that can be seen from its center. Thus, $R_a$ varies between ]$-R_{sun}$, $R_{sun}$[:

$$R_\alpha = \frac{D_{Sun}(H_{RSO} - R_{Eq})}{\|\vec{Proj}_{RSO}\|} - R_{Eq}$$

$\varepsilon\alpha$ may be defined as the portion of the Sun covered by the ellipse with one of its semi-axes set as $1-|R_a|$:

$$\varepsilon_\alpha = \frac{R_{Sun} - |R_\alpha|}{2R_{Sun}^2}\sqrt{R_{Sun}^2 - |R_\alpha|^2}$$

According to aspects of one or more embodiments, the Sun intensity $I_{Sun}$ may then be:

$$I_{Sun} = \begin{cases} \varepsilon_\alpha, & R_\alpha < 0 \\ 1 - \varepsilon_\alpha, & R_\alpha \geq 0 \end{cases}$$

According to aspects of one or more embodiments, according to the presently described illustrative model, it may be considered that the limit of the Solar disk is a straight line rather than an actual arc. Comparing the formula with STK gives for a given GEO satellite the Sun penumbra:

| STK Sun Intensity | Sun Intensity |
|---|---|
| 0.99 | 0.98 |
| 0.70 | 0.66 |
| 0.52 | 0.50 |
| 0.058 | 0.05 |

Magnitude Model of the Detectability Model

According to aspects of one or more embodiments, the detectability model may include a magnitude model for determining the magnitude of light from an RSO hitting the sensor of the simulated satellite. The magnitude of the light may be a function of light of the Sun reflected by the RSO, thermal emissions by the RSO, and photometry modelling of the sensor of the simulated satellite. Thus, the magnitude model may determine the magnitude of the light based on the size, shape and material of the RSO, as well as the intensity value associated with the RSO, sensor parameters of the sensor (e.g., simulated configuration(s) of simulated sensors), among other factors or any combination thereof.

To illustrate determining an intensity value of an RSO, an example algorithm may include as follows:

According to aspects of one or more embodiments, to determine the magnitude of reflected light, the magnitude model may give the flux of a Lambertian spherical RSO that reflects the Sun flux by:

$$F_{RSO} = \frac{F_{Sun} I_{Sun} \pi R_{RSO}^2 \alpha}{4\pi d^2} \times \frac{8(\sin\varphi + (\pi - \varphi)\cos\varphi)}{3\pi}$$

Where, $F_{Sun}$ is the Sun flux (W/m$^2$), a the albedo of the RSO, $R_{RSO}$ (m) the radius of the spherical RSO, d (m) the distance to the observer, q the phase angle (angle between RSO-Sun and RSO-Observer). Thus, according to aspects of one or more embodiments, the magnitude of the reflected light can then be derived as:

$$m_{RSO} = m_{Sun} - 2.5\log_{10}\left(R_{RSO}^2 \alpha I_{Sun} \frac{2(\sin\varphi + (\pi - \varphi)\cos\varphi)}{3\pi}\right) + 5\log_{10} d$$

According to aspects of one or more embodiments, to determine the magnitude of thermal emissions, magnitude model may determine the flux (radiance, [W/m$^2$ sr]) of a spherical RSO that emits as a graybody as:

$$F_{RSO} = \pi R_{RSO}^2 \times \frac{\int_{\lambda_1}^{\lambda_2} L_{BB}(\lambda, T_{RSO}) \cdot \epsilon(\lambda) d\lambda}{d^2}$$

Where $\pi R_{RSO}^2$ is the RSO projected area, $\epsilon(\lambda)$ the emissivity of the RSO (independent of wavelength for now), $R_{RSO}$ (m) the radius of the spherical RSO, $T_{RSO}$ (K) the temperature of the RSO (assumed constant for now), d (m) the distance to the observer, with the spectral radiance ([W/m$^3$·sr]) being:

$$L_{BB}(\lambda, T_{RSO}) = \frac{c_1}{\lambda^5} \frac{1}{\exp\left(\frac{c_2}{\lambda T_{RSO}}\right) - 1}$$

$$c_1 = 2hc^2, \; c_2 = \frac{hc}{k_B}$$

According to aspects of one or more embodiments, the power at detector [W] may then be given by:

$$P_{det} = A_{aperture} * \text{SolidAngle} * F_{RSO}$$

Where $A_{aperture}$ is: pR$^2$ and Solid_angle is Ifov$^2$, and thus may determine energy as a function of power and $t_{int}$.

According to aspects of one or more embodiments, the magnitude may then be derived as:

$$m_{RSO} = m_{Sun/Vega} - 2.5\log_{10}\left(\frac{F_{RSO}}{F_{sun/Vega}}\right)$$

Where $m_{Sun}$, $F_{Sun}$ are integrated magnitude and flux in the appropriate wavelength range (M/LWIR) for the Sun (or Vega).

Photometry Model(s) of the Detectability Model

In some embodiments, the detectability model may use one or more photometry models to simulate the perception of light originating from a simulated RSO according to the intensity and/or magnitude models detailed above. A photometry model is a quantitative framework used to measure and describe the properties of light in a way that aligns with the perception of the simulated sensor, and thus is configured for the simulated parameters of the sensor. Indeed, where the intensity model and magnitude model describe one or more measurements of radiant energy (e.g., light) from a simulated RSO, photometry quantifies the simulated sensors perceptions of such measurements. For example, the photometry model may determine a luminous intensity based on the intensity value and the simulated parameters of the simulated sensor. In another example, the photometry model may determine a luminance or perceived magnitude and/or flux based on the flux and/or magnitude determined for the RSOs and/or stars to quantify the simulated sensor's perception of the magnitude and/or flux.

According to aspects of one or more embodiments, the photometry model may determine the perceived intensity and/or luminance based on the flux and/or magnitude (for stars and incidentally RSOs) being calibrated according to the wavelength range used. According to aspects of one or more embodiments, the wavelength may be a function of the sensor being used and thus may be configured via the constellation parameters 1. For example, possible sensors may include charge coupled device (CCD), electron multiplying CDD (EMCCD), intensified CCD (ICCD), complementary metal-oxide-semiconductor CMOS, short wavelength infrared (SWIR) (e.g., about 0.9 to 1.7 micrometers in length), middle wavelength infrared (MWIR) (e.g., about 3.0 to 5.0 micrometers in length), long wavelength infrared (LWIR) (e.g., about 8.0 to 14.0 micrometers in length), among others or any combination thereof.

According to aspects of one or more embodiments, to account for the wavelength being detected, e.g., the sensor being simulated, the detectability model may employ one or more of a set of photometry models configured for the wavelength. For example, there may be two or more photometry models available in the simulator, such as, e.g., a Sun photometry model and a Vega photometry model.

According to aspects of one or more embodiments, to account for the L/MWIR range in the Sun/Vega model, the Sun/Vega fluxes may be integrated to the respective magnitudes.

To illustrate a Sun/Vega photometry model, an example algorithm may include as follows:

According to aspects of one or more embodiments, a set of L/MWIR bands may be obtained for an all-sky survey (e.g., via the ALL-WISE survey). The four WISE bands range from 2-30 micrometers (see FIG. 15). According to aspects of one or more embodiments, for MWIR purposes, fluxes from W1 and W2 bandpasses may be added. Depending on the sensor exact range, 2-MASS J,H,K filters may be added. According to aspects of one or more embodiments, for LWIR purposes, W3 alone may be sufficient.

According to aspects of one or more embodiments, effective wavelengths for W1, W2, W3 of the WISE bands may be: 3.368, 4.618 and 12.082 micrometers.

According to aspects of one or more embodiments, for the VEGA model, WISE magnitudes of Vega may be calibrated, with the zero-magnitude flux density, an example of which is given in Table 1 of WISE All-Sky Release Explanatory Supplement: Data Processing.

According to aspects of one or more embodiments, since W3 is a wide bandpass, a color correction may be employed (for example: objects with strongly varying spectra within the bandpass). Many stars do not require this correction.

TABLE 1

WISE Zero Magnitude Attributes

| Band | In-Band W cm$^{-2}$ Unc(InBd) W cm$^{-2}$ | Bw µm Unc(Bw) µm | $F_\lambda$(iso) W cm$^{-2}$ µm$^{-1}$ Unc($F_\lambda$) W cm$^{-2}$ µm$^{-1}$ | $\lambda$(iso) µm Unc($\lambda$) µm | Bw Hz Unc(Bw) Hz | v(iso) Hz Unc(v) Hz | $F_v$(iso) Jy Unc($F_v$) Jy | $F_v$ (iso) JY Unc($F_v$) Jy | AB mag |
|---|---|---|---|---|---|---|---|---|---|
| W1 | 5.4188E−15 | 6.6256E−01 | 8.1787E−15 | 3.3526 | 1.7506E+13 | 8.8560E+13 | 309.540 | 306.682 | 2.699 |
|    | 7.966E−17  | 1.2168E−03 | 1.25118E−16 | 0.0132 | 3.0407E+10 | 7.2306E+11 | 4.582 | 4.600 |  |
| W2 | 2.5172E−15 | 1.042E+00  | 24150E−15  | 4.6028 | 1.4653E+13 | 6.4451E+13 | 171.787 | 170.663 | 3.339 |
|    | 3.6858E−17 | 1.0982E−03 | 3.5454E−17 | 0.0168 | 1.1759E+10 | 5.0629E+11 | 2.516 | 2.600 |  |
| W3 | 3.5878E−16 | 5.5069E+00 | 6.5151E−17 | 11.5608 | 1.1327E+13 | 2.6753E+13 | 31.674 | 29.045 | 6285 |
|    | 5.3306E−18 | 1.6942E−02 | 9.8851E−19 | 0.0446 | 8.5791E+09 | 1.9731E+11 | .450 | 0.436 |  |
| W4 | 2.0876E−17 | 4.1013E+00 | 5.0901E−18 | 22.0883 | 2.4961E+12 | 1.3456E+13 | 8.363 | 8.284 | 6.620 |
|    | 3.7888E−19 | 4.4812E−02 | 1.0783E−9  | 0.1184 | 40207E+09 | 1.0049E+11 | 0.293f | 0.290 |  |

Figure 15:
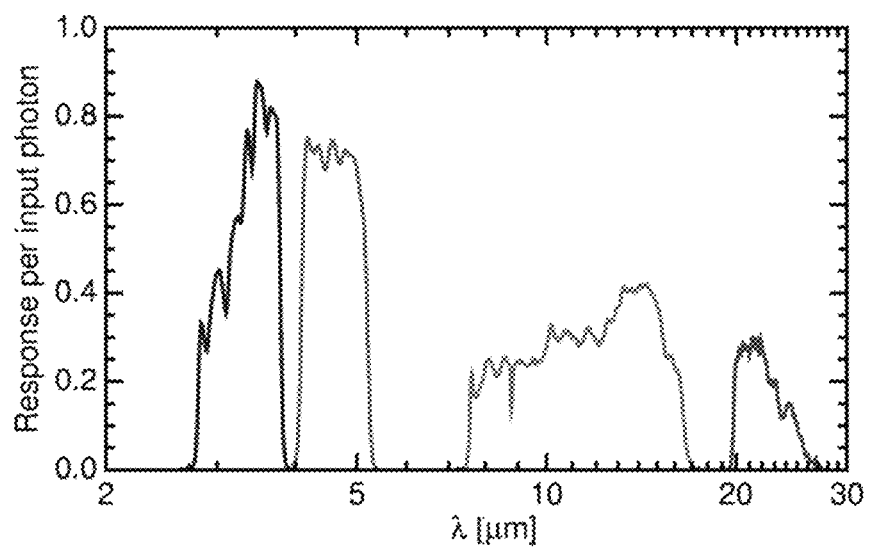
FIG. 15 illustrates an example WISE response per photon for W1 to W4 based on quantum efficiencies and optic transmissions for a sensor of a simulated satellite in accordance with one or more embodiments of the present disclosure.

According to aspects of one or more embodiments, an example of a relative response system for W1 to W4 (e.g., quantum efficiencies times optic transmissions, etc.) files may be shown in FIG. 15, which illustrates the WISE response per photon. According to aspects of one or more embodiments, the quantum efficiency times the transmission of the optics, beamsplitters and filters. According to aspects of one or more embodiments, data files including the wavelength, e.g., in microns, the response, and the uncertainty in the response in parts per thousand are available for W1, W2, W3 and W4. According to aspects of one or more embodiments, the Relative Spectral Response curves of FIG. 15 may be constructed from measurements of a whole system supplemented by component measurements and the expected value from the design, e.g., based on the constellation parameters 1. According to aspects of one or more embodiments, for a signal with a spectrum having v Fv=const, the effective wavelengths of the four bands may be given by 3.368, 4.618, 12.082 and 22.194 μm. The effective wavelength may be defined such that infinitesimal power law changes to the spectrum, pivoting about the effective wavelength, do not change the integrated response:

$$\lambda_e = \exp\left[\frac{\int \ln \lambda \; R(\lambda) \; F_v \; d \ln v}{\int R(\lambda) \; F_v \; d \ln v}\right]$$

According to aspects of one or more embodiments, for the Sun photometry model, examples of absolute magnitudes calculated for some or all of the filters can be found in table 3 of Willmer, C. N. A., "The Absolute Magnitude of the Sun in Several Filters", The Astrophysical Journal Supplement Series, vol. 236, no. 2, IOP, 2018. doi: 10.3847/1538-4365/aabfdf., which is incorporated herein by reference in its entirety.

According to aspects of one or more embodiments, for W1, W2, and W3 the apparent magnitude may be roughly equal to the value of: SOLAR_MAG_W=−28.3. (This value may be established as a constant and/or a variable determined by the constellation parameters 1).

According to aspects of one or more embodiments, the exposition time may be calculated as the time a moving RSO remains within a pixel. In some embodiments, the exposition time may have a maximum which may be configured and/or determined based on the exposure time of the sensor configuration, such as, e.g., a maximum of 1 second. According to aspects of one or more embodiments, the exposition time may, thus, be dependent on the velocity of the RSO relative to the sensor frame.

According to aspects of one or more embodiments, knowing the vectors Psat Vsat and Prso Vrso in the sensor inertial frame, the velocity of the RSO respectively to the rotating sensor may be given by in international unit:

$$\overrightarrow{V'_{RSO}} = \left(\overrightarrow{V_{RSO}} - \overrightarrow{V_{Sat}}\right) - \vec{\Omega} \times \left(\overrightarrow{P_{RSO}} - \overrightarrow{P_{Sat}}\right)$$

$$\overrightarrow{V'_{RSO}} = \left(\overrightarrow{V_{RSO}} - \overrightarrow{V_{Sat}}\right) - \frac{\overrightarrow{P_{Sat}} \times \overrightarrow{V_{Sat}}}{\|\overrightarrow{P_{Sat}}\|^2} \times \left(\overrightarrow{P_{RSO}} - \overrightarrow{P_{Sat}}\right)$$

According to aspects of one or more embodiments, the exposition time may therefore be expressed by:

$$t = \min\left(\frac{1}{\|V'_{pixelRSO}\|}, 1\right)$$

Where V'pixelRSO is expression in pixel/s within the sensor plane (the component on the Z-axis is not considered here).

According to aspects of one or more embodiments, the signal to noise ratio (SNR) of a frame produced by the imaging device of the simulated satellite may be calculated based on the PSF area and/or the PSF energy. According to aspects of one or more embodiments, the PSF area and/or the PSF energy may be defined according to the sensor parameters of the constellation parameters 1.

According to aspects of one or more embodiments, the PSF area may define the pixel area where a threshold percentage (e.g., greater than 70, 75, 80, 85 or more percent) of the energy of a static PSF is encircled. For example, for a particular sensor, the PSF area may be determined to be a 3 pixel by 3-pixel area, or 9 total pixels in area.

According to aspects of one or more embodiments, the PSF energy may define the ratio of energy from a static PSF, that a center pixel area (which size is defined by PSF_AREA) actually encircles given a PSF overlapping effect of a moving target.

According to aspects of one or more embodiments, for detectability, the metric of interest may be defined as the "average pixel SNR over the PSF area," which may be defined as follows, where:

$F_{photonRSO}$ is the flux of the RSO expressed in photons(s)

$k_{instrument}$ is a factor that depends on the telescope and sensor expressed in m$^2$·s.e-·photon−1 and is a function of:
  Telescope aperture
  Quantum efficiency
  transmittance $N_{PSF}$ is the number of pixels that encircled $k_{PSF}$ energy of the PSF modeled, e.g., as Gaussian (for example about 0.88 for $N_{PSF}$=9 (3×3) for a static PSF)

$k_{PSF}$ for a moving target is modified so that it considers the fact that the same PSF area may capture energy for more than 1 t (exposition time as previously defined). In some embodiments, the $k_{PSF}$ value is the combination of the static PSF and the amount of exposition time that should be considered to integrate the signal over the PSF area. Thus, for example, for $N_{PSF}$=9 [3×3], $k_{PSF}$ may be approximately 2.2 instead of 0.8.

According to aspects of one or more embodiments, the sources of noise (e-) for the SNR computation may include:
  $N_s$ signal noise,
  $N_{dark}$ dark current,
  $N_{back}$ background noise,
  $N_{quantization}$ quantization noise,
  $N_{readout}$ readout noise As a result, in some embodiments, SNR may be determined as:

$$SNR_{PSF} = \frac{F_{photonRSO} \times t \times k_{instrument} \times k_{PSF}}{\sqrt{N_{PSF}\left(N_{readout}^2 + N_{dark}^2 + N_{back}^2 + N_{quantization}^2\right) + N_s^2}}$$

$$<SNR> = \frac{SNR_{PSF}}{\sqrt{N_{PSF}}}$$

According to aspects of one or more embodiments, by default, the simulated spacecraft may follow a nominal attitude (based on VVLH) throughout the simulation period when the custom attitude configuration is not provided or not specified in a global configuration. However, the user may choose to modify that behavior by providing offset to the nominal attitude (roll, pitch, yaw in degrees, respectively applicable on the X, Y and Z axis of the LOF) at given timestamp offset to the initial date of the scenario.

According to aspects of one or more embodiments, such custom attitude configuration may define values including:
  a. CORRECT_ROLL, CORRECT_PITCH, CORRECT_YAW to compensate movement of the spacecraft that may be used to simulate a gimble, for example. According to aspects of one or more embodiments, CORRECT_ROLL, CORRECT_PITCH, CORRECT_YAW may be defined in degrees·sec$^{-1}$ or other unit.

b. T_EXP [sec] may also only used by detectability assessment so evaluate a different image exposure/integration time that would be different from the one given in the sensor configuration of the constellation parameters 1.

According to aspects of one or more embodiments, the result of the detectability analysis may include a determination of whether each event is detectable by the RSO based on the photometry and sensor-based calculation detailed above, including the perception of the simulated sensor and the calculated SNR. Indeed, some events may include RSOs that reflect such faint light as to be effectively "lost in the noise" and thus undetectable by the sensor based on the sensor parameters, e.g., where the perceived intensity and/or luminance is equal to or below the SNR for the sensor.

Figure 10:
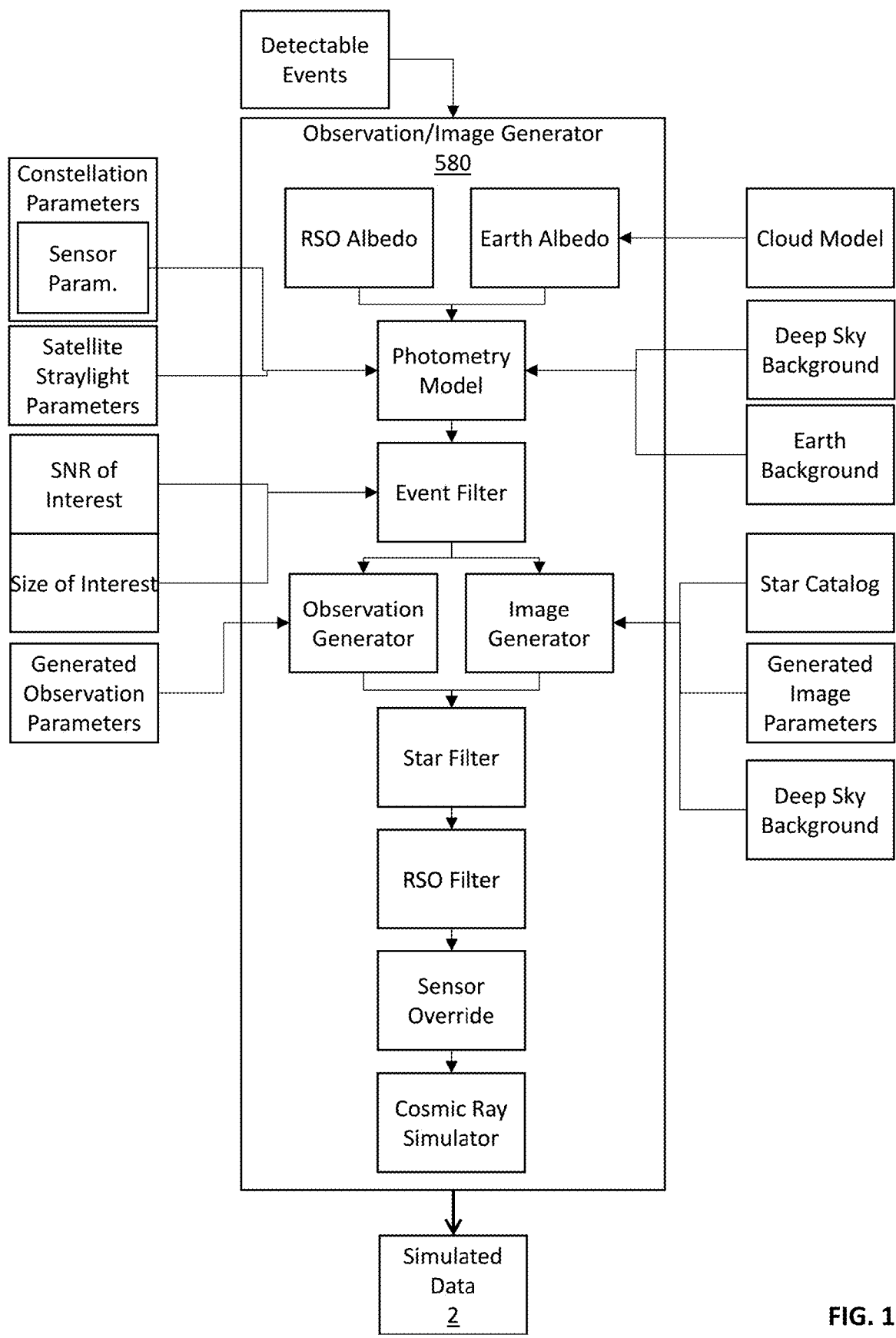
FIG. 10 depicts a schematic diagram of an observation/image generator of the exemplary computer-based simulator for simulation of space-based imaging of RSOs in accordance with one or more embodiments of the present disclosure.

According to aspects of one or more embodiments, for the detectable events, the simulator 500 may employ an observation/image generator 580 (e.g., as depicted is further detail in FIG. 10). According to aspects of one or more embodiments, the observation/image generator 580 may simulate at least one simulated image of the detectable event for at least one particular RSO, based at least in part on at least one image generation model, the sensor configuration and image simulation parameters.

According to aspects of one or more embodiments, the image simulation parameters may include parameters including and associated with the photometry. The photometry model employed by the observation/image generator 580 may be the same or different from the photometry model of the detectability engine 570. Moreover, the parameters of the photometry model of the observation/image generator 580 may be the same or different from the parameters of the photometry model of the detectability engine 570.

According to aspects of one or more embodiments, the background parameters may include a definition of a background of the sky within which the detectable event is set, such as, e.g., stars and constellations, planets, asteroids and/or asteroid fields, among other background features of space. According to aspects of one or more embodiments, the background parameters may further define the background radiation (e.g., in the IR and/or visible range), such as, e.g., constant, Manual Linear gradient, or other background or any combination thereof.

According to aspects of one or more embodiments, the observation/image generator 580 may generate observations using observation-specific parameters, such as, e.g., in-track/offtrack pixel uncertainty and/or a maximum number of events. According to aspects of one or more embodiments, an observation may refer to a derived state vector or other position and/or trajectory data for the detectable event. Thus, the observation may be characterized by position, velocity and/or covariance, among other data or any combination thereof, based on simulated output of the sensor of the imaging device of the simulated satellite. Indeed, based on the photometry model, the pixels of the sensor that detect the reflected light of a particular simulated RSO, and the magnitudes detected by each pixel, may be simulated to create simulated streaklets as depicted in FIG. 4. Based on the streaklets, data including velocity, orientation and/or orbital regime may be derived from the simulated output of the sensor.

According to aspects of one or more embodiments, in-track and/or offtrack pixel uncertainties may define a tolerance for uncertainty of the derived data from the simulated output.

According to aspects of one or more embodiments, similar to the observations, the photometry model may produce simulated output of the sensor. According to aspects of one or more embodiments, based on the photometry model, the pixels of the sensor that detect the reflected light of a particular simulated RSO, and the magnitudes detected by each pixel, may be simulated to create simulated streaklets as depicted in FIG. 4. Based on the streaklets, an image whereby the pixels of the output frame corresponding to the streaklets may be generated with pixel values representative of the magnitude of light of the RSO at each pixel. According to aspects of one or more embodiments, the pixel values may be monochromatic intensity, panchromatic (e.g., no filter), or other representation or any combination thereof. According to aspects of one or more embodiments, the image generator may additionally apply a star background and/or a deep sky background to set the simulated streaklets within a background. According to aspects of one or more embodiments, the image generator may identify a position of the detected event based on the FOV of the simulated satellite and the position of the simulated RSO. Using known star positions, e.g., based on the time of year, stars of the star catalog can be mapped to the image as features of a background behind the simulated RSO for the simulated event. Similarly, the position may be used to determine a deep sky background associated with the position to provide further features as background to the simulated event. Thus, the streaklet of the detected event, the stars and the deep sky background may be aggregated into a simulated image of the detected event.

According to aspects of one or more embodiments, image-specific parameters of the observation/image generator 580 may include, e.g., sensor integration time, maximum images to generate, maximum images per event, among others or any combination thereof. According to aspects of one or more embodiments, the image-specific parameters may be defined in the global configuration and/or the constellation parameters 1 (e.g., the sensor parameters). Thus, a number and exposure of image frames may be established.

According to aspects of one or more embodiments, the simulator 500 may be used to assess the performance of not just the sensor of the simulated satellites of the constellation, but also the data processing pipelines for object detection and/or object determination, as well as any downstream data processing. Thus, may apply filters as a selection mechanism. The filters may be employed to select which images to simulate—and/or what objects, bodies, noise, etc. to draw within an image. Moreover, such filters may be further usable to filter out stars and/or RSOs that do not satisfy image-specific parameters for the RSO and/or star to appear in the image. For example, the RSO filter may utilize, e.g., a filter derived from NORAD RSO data, a number of objects per orbital regime, or other filtering or any combination thereof. According to aspects of one or more embodiments, the filters may be user selectable and/or automated so as to filter out unwanted images.

According to aspects of one or more embodiments, the observation/image generator 580 may further augment the images based on sensor specifications override. According to aspects of one or more embodiments, the sensor parameters of the constellation parameters 1 may include parameters that represent what the sensor can detect and how to apply the photometry model, but may not be representative of the actual image output, for example upon post-processing of the image produced by the sensor, or for other reasons or any combination thereof. According to aspects of one or more embodiments, the sensor override may include, e.g., center offset, photo/pixel response non-uniformity (PRNU)

sigma (e.g., pixel response non uniformity, but can be ignored as effect may be included in gain), dark current model based on temperature variation and spatial Flechet distribution, quantum efficiency (e.g., UBVRI band, full-spectrum (e.g., csv format or other format), etc.), polynomial distortion, opto-electronic gain variation (e.g., polynomial), Gaussian PSF definition and/or focal plane variation (e.g., polynomial), among others or any combination thereof.

According to aspects of one or more embodiments, the observation/image generator 580 may further augment the images with cosmic rays. According to aspects of one or more embodiments, cosmic rays may strike the sensor and create artifacts. Accordingly, the observation/image generator 580 may generate simulated cosmic rays, e.g., via random generation, known cosmic rays, among other techniques or any combination thereof. According to aspects of one or more embodiments, the effects of the simulated cosmic rays (e.g., a single frame streaklet) may be simulated to add the cosmic ray to one or more image frames of the detected event.

As a result, according to aspects of one or more embodiments, the observation/image generator 580 may output event imagery for the RSOs associated with the detectable event based at least in part on the at least one photometry model, the at least one RSO configuration and the at least one sensor configuration.

According to aspects of one or more embodiments, the observation/image generator 580 may also or instead generate statistics for the detected event. According to aspects of one or more embodiments, the statistics may include a number, size, intensity and/or ephemerides of the RSO of the detected event. According to aspects of one or more embodiments, the statistic may also or instead include a number of detected events relative to a number of events found, such as e.g., a ratio, percent, or other metric representative of the number of events that were detectable by the simulated satellite.

According to aspects of one or more embodiments, the statistic is indicative of a performance of the sensor configuration based at least in part on the detectable event associated with one or more particular RSOs and/or the event image associated with the particular RSO.

According to aspects of one or more embodiments, the observation, image and/or statistic for each detected event may be output to one or more computing devices associated with a user so as to provide to the user the simulated performance of the constellation of simulated satellites. Thus, the simulator 500 may provide to the user a virtual prototype and the performance thereof of space-based imaging for RSO detection.

FIG. 6 depicts a schematic diagram of a constellation ephemerides generator 540 of the exemplary computer-based simulator 500 for simulation of space-based imaging of RSOs in accordance with one or more embodiments of the present disclosure.

Figure 7:
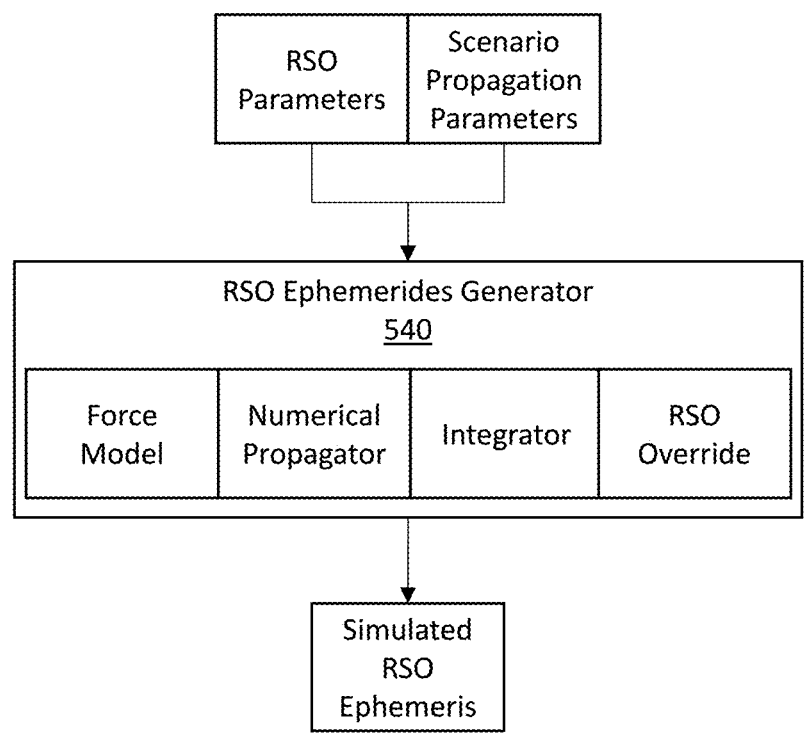
FIG. 7 depicts a schematic diagram of an RSO ephemerides generator of the exemplary computer-based simulator for simulation of space-based imaging of RSOs in accordance with one or more embodiments of the present disclosure.

FIG. 7 depicts a schematic diagram of an RSO ephemerides generator 550 of the exemplary computer-based simulator 500 for simulation of space-based imaging of RSOs in accordance with one or more embodiments of the present disclosure.

FIG. 8 depicts a schematic diagram of an event finder engine 560 of the exemplary computer-based simulator 500 for simulation of space-based imaging of RSOs in accordance with one or more embodiments of the present disclosure.

FIG. 9 depicts a schematic diagram of a detectability engine 570 of the exemplary computer-based simulator 500 for simulation of space-based imaging of RSOs in accordance with one or more embodiments of the present disclosure.

FIG. 10 depicts a schematic diagram of an observation/image generator 580 of the exemplary computer-based simulator 500 for simulation of space-based imaging of RSOs in accordance with one or more embodiments of the present disclosure.

Figure 11:
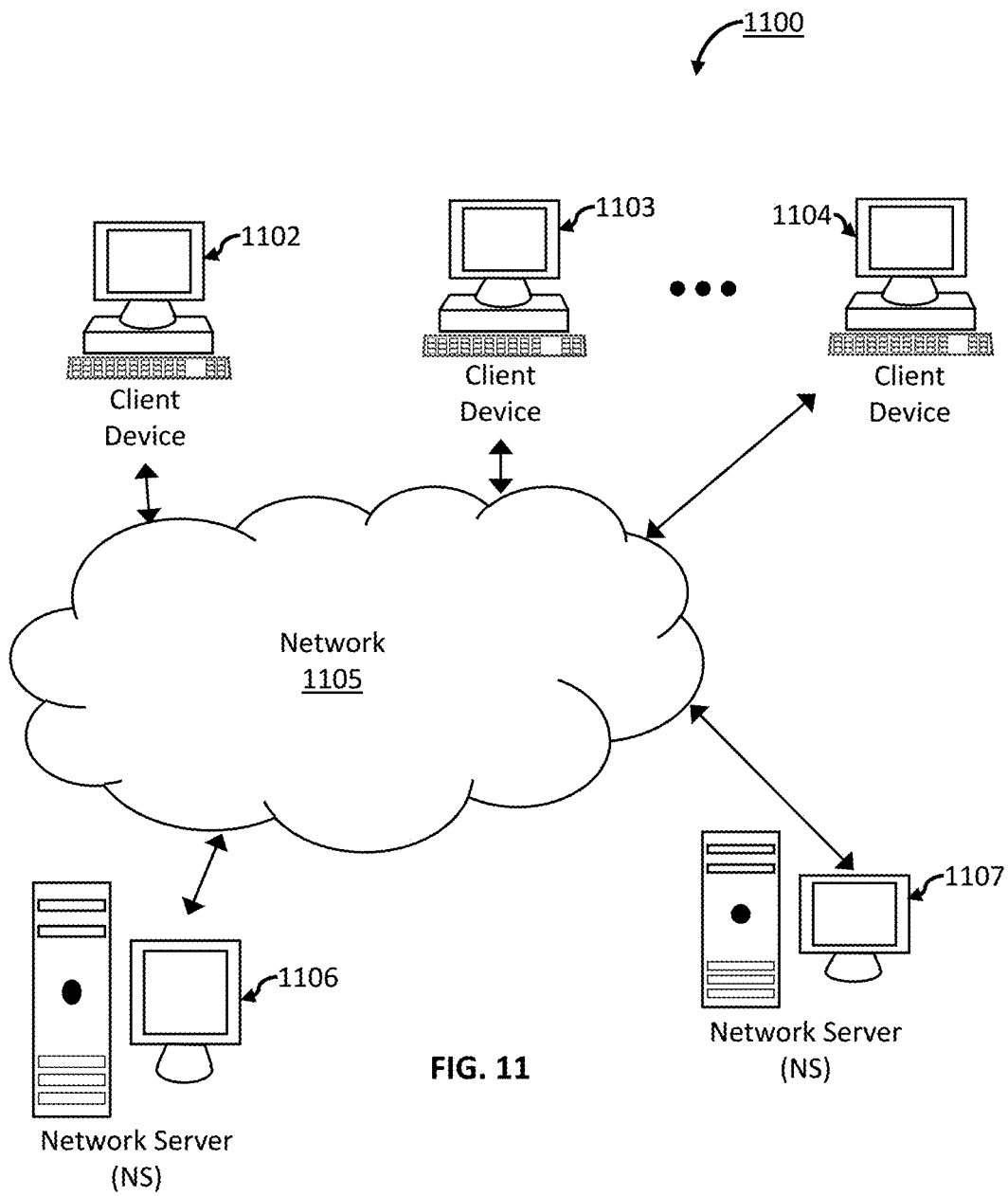
FIG. 11 depicts a block diagram of an exemplary computer-based simulator for simulation of space-based imaging of RSOs in accordance with one or more embodiments of the present disclosure.

FIG. 11 depicts a block diagram of an exemplary computer-based system and platform 1100 in accordance with one or more embodiments of the present disclosure. However, not all of these components may be required to practice one or more embodiments, and variations in the arrangement and type of the components may be made without departing from the spirit or scope of various embodiments of the present disclosure. According to aspects of one or more embodiments, the illustrative computing devices and the illustrative computing components of the exemplary computer-based system and platform 1100 may be configured to manage a large number of members and concurrent transactions, as detailed herein. According to aspects of one or more embodiments, the exemplary computer-based system and platform 1100 may be based on a scalable computer and network architecture that incorporates varies strategies for assessing the data, caching, searching, and/or database connection pooling. An example of the scalable architecture is an architecture that is capable of operating multiple servers.

According to aspects of one or more embodiments, referring to FIG. 11, client device 1102, client device 1103 through client device 1104 (e.g., clients) of the exemplary computer-based system and platform 1100 may include virtually any computing device capable of receiving and sending a message over a network (e.g., cloud network), such as network 1105, to and from another computing device, such as servers 1106 and 1107, each other, and the like. According to aspects of one or more embodiments, the client devices 1102 through 1104 may be personal computers, multiprocessor systems, microprocessor-based or programmable consumer electronics, network PCs, and the like. According to aspects of one or more embodiments, one or more client devices within client devices 1102 through 1104 may include computing devices that typically connect using a wireless communications medium such as cell phones, smart phones, pagers, walkie talkies, radio frequency (RF) devices, infrared (IR) devices, integrated devices combining one or more of the preceding devices, or virtually any mobile computing device, and the like. According to aspects of one or more embodiments, one or more client devices within client devices 1102 through 1104 may be devices that are capable of connecting using a wired or wireless communication medium such as a PDA, POCKET PC, wearable computer, a laptop, tablet, desktop computer, a video game device, a smart phone, an ultra-mobile personal computer (UMPC), and/or any other device that is equipped to communicate over a wired and/or wireless communication medium (e.g., NFC, RFID, NBIOT, 3G, 4G, 5G, GSM, GPRS, WiFi, WiMax, CDMA, OFDM, OFDMA, LTE, satellite, ZigBee, etc.). According to aspects of one or more embodiments, one or more client devices within client devices 1102 through 1104 may include may run one or more applications, such as Internet browsers, mobile applications, voice calls, video games, videoconferencing, and email, among others. According to aspects of one or more embodiments, one or more client devices within client devices 1102 through 1104 may be configured to receive and to send web pages, and the like. According to aspects of one or more embodiments, an exemplary specifically programmed browser application of the present disclosure may be configured to receive and display graphics, text, multimedia, and the like, employing virtually any web based language, including, but not limited to Standard Generalized Markup Language (SMGL), such as HyperText Markup Language (HTML), a wireless application protocol (WAP), a Handheld Device Markup Language (HDML), such as Wireless Markup Language (WML), WMLScript, XML, JavaScript, and the like. According to aspects of one or more embodiments, a client device within client devices 1102 through 1104 may be specifically programmed by either Java, .Net, QT, C, C++, Python, PHP and/or other suitable programming language. In some embodiment of the device software, device control may be distributed between multiple standalone applications. According to aspects of one or more embodiments, software components/applications can be updated and redeployed remotely as individual units or as a full software suite. According to aspects of one or more embodiments, a client device may periodically report status or send alerts over text or email. According to aspects of one or more embodiments, a client device may contain a data recorder which is remotely downloadable by the user using network protocols such as FTP, SSH, or other file transfer mechanisms. According to aspects of one or more embodiments, a client device may provide several levels of user interface, for example, advance user, standard user. According to aspects of one or more embodiments, one or more client devices within client devices 1102 through 1104 may be specifically programmed include or execute an application to perform a variety of possible tasks, such as, without limitation, messaging functionality, browsing, searching, playing, streaming or displaying various forms of content, including locally stored or uploaded messages, images and/or video, and/or games.

According to aspects of one or more embodiments, the exemplary network 1105 may provide network access, data transport and/or other services to any computing device coupled to it. According to aspects of one or more embodiments, the exemplary network 1105 may include and implement at least one specialized network architecture that may be based at least in part on one or more standards set by, for example, without limitation, Global System for Mobile communication (GSM) Association, the Internet Engineering Task Force (IETF), and the Worldwide Interoperability for Microwave Access (WiMAX) forum. According to aspects of one or more embodiments, the exemplary network 1105 may implement one or more of a GSM architecture, a General Packet Radio Service (GPRS) architecture, a Universal Mobile Telecommunications System (UMTS) architecture, and an evolution of UMTS referred to as Long Term Evolution (LTE). According to aspects of one or more embodiments, the exemplary network 1105 may include and implement, as an alternative or in conjunction with one or more of the above, a WiMAX architecture defined by the WiMAX forum. In some embodiments and, optionally, in combination of any embodiment described above or below, the exemplary network 1105 may also include, for instance, at least one of a local area network (LAN), a wide area network (WAN), the Internet, a virtual LAN (VLAN), an enterprise LAN, a layer 3 virtual private network (VPN), an enterprise IP network, or any combination thereof. In some embodiments and, optionally, in combination of any embodiment described above or below, at least one computer network communication over the exemplary network 1105 may be transmitted based at least in part on one of more communication modes such as but not limited to: NFC, RFID, Narrow Band Internet of Things (NBIOT), ZigBee, 3G, 4G, 5G, GSM, GPRS, WiFi, WiMax, CDMA, OFDM, OFDMA, LTE, satellite and any combination thereof. According to aspects of one or more embodiments, the exemplary network 1105 may also include mass storage, such as network attached storage (NAS), a storage area network (SAN), a content delivery network (CDN) or other forms of computer or machine-readable media.

According to aspects of one or more embodiments, the exemplary server 1106 or the exemplary server 1107 may be a web server (or a series of servers) running a network operating system, examples of which may include but are not limited to Apache on Linux or Microsoft IIS (Internet Information Services). According to aspects of one or more embodiments, the exemplary server 1106 or the exemplary server 1107 may be used for and/or provide cloud and/or network computing. Although not shown in FIG. 11, According to aspects of one or more embodiments, the exemplary server 1106 or the exemplary server 1107 may have connections to external systems like email, SMS messaging, text messaging, ad content providers, etc. Any of the features of the exemplary server 1106 may be also implemented in the exemplary server 1107 and vice versa.

According to aspects of one or more embodiments, one or more of the exemplary servers 1106 and 1107 may be specifically programmed to perform, in non-limiting example, as authentication servers, search servers, email servers, social networking services servers, Short Message Service (SMS) servers, Instant Messaging (IM) servers, Multimedia Messaging Service (MMS) servers, exchange servers, photo-sharing services servers, advertisement providing servers, financial/banking-related services servers, travel services servers, or any similarly suitable service-base servers for users of the client devices 1101 through 1104.

In some embodiments and, optionally, in combination of any embodiment described above or below, for example, one or more exemplary computing client devices 1102 through 1104, the exemplary server 1106, and/or the exemplary server 1107 may include a specifically programmed software module that may be configured to send, process, and receive information using a scripting language, a remote procedure call, an email, a tweet, Short Message Service (SMS), Multimedia Message Service (MMS), instant messaging (IM), an application programming interface, Simple Object Access Protocol (SOAP) methods, Common Object Request Broker Architecture (CORBA), HTTP (Hypertext Transfer Protocol), REST (Representational State Transfer), SOAP (Simple Object Transfer Protocol), MLLP (Minimum Lower Layer Protocol), or any combination thereof.

Figure 12:
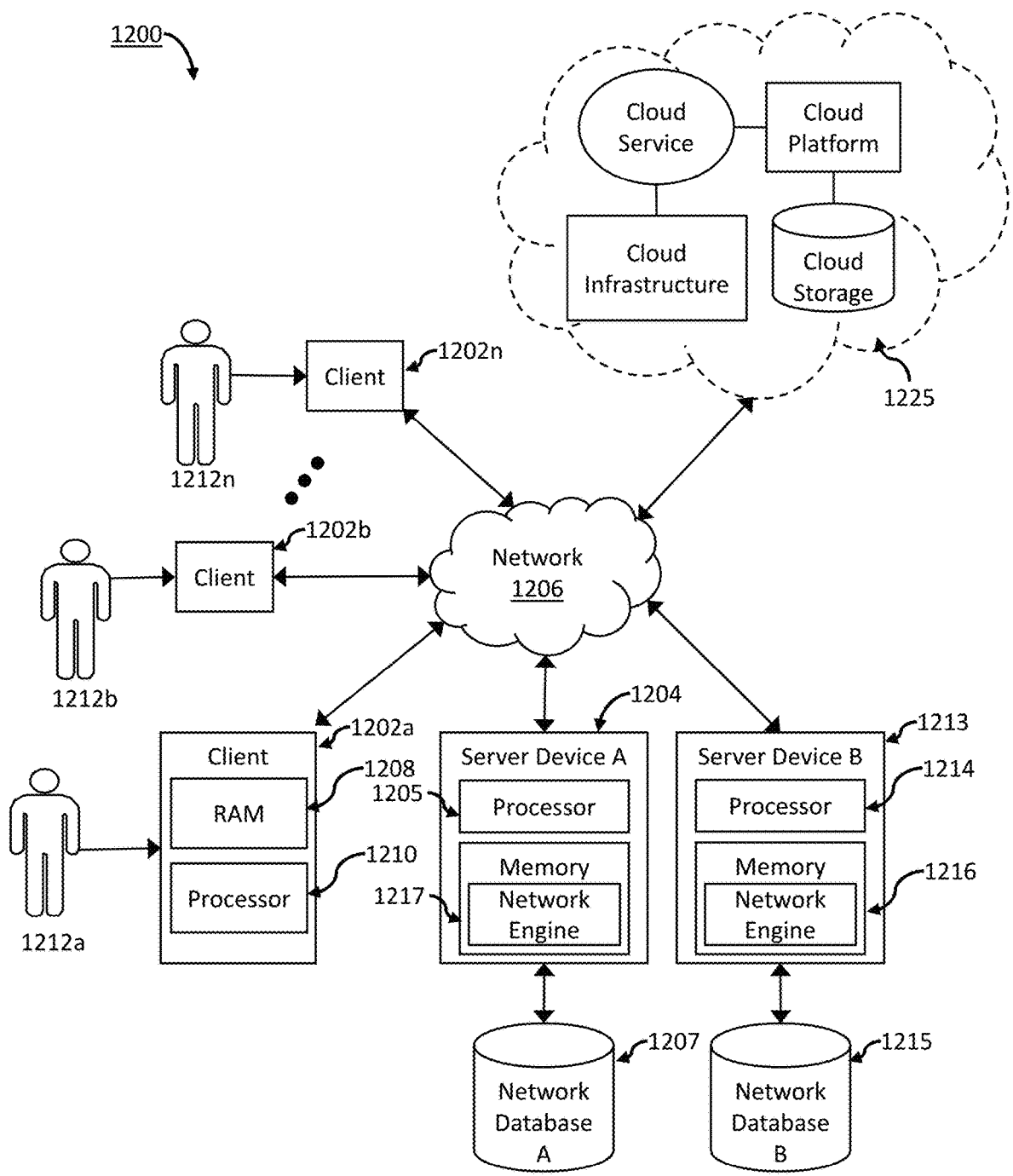
FIG. 12 depicts a block diagram of another exemplary computer-based simulator for simulation of space-based imaging of RSOs in accordance with one or more embodiments of the present disclosure.

FIG. 12 depicts a block diagram of another exemplary computer-based system and platform 1200 in accordance with one or more embodiments of the present disclosure. However, not all of these components may be required to practice one or more embodiments, and variations in the arrangement and type of the components may be made without departing from the spirit or scope of various embodiments of the present disclosure. According to aspects of one or more embodiments, the client device 1202a, client device 1202b through client device 1202n shown each at least includes a computer-readable medium, such as a random-access memory (RAM) 1208 coupled to a processor 1210 or FLASH memory. According to aspects of one or more embodiments, the processor 1210 may execute computer-executable program instructions stored in memory 1208. According to aspects of one or more embodiments, the processor 1210 may include a microprocessor, an ASIC, and/or a state machine. According to aspects of one or more embodiments, the processor 1210 may include, or may be in communication with, media, for example computer-readable media, which stores instructions that, when executed by the processor 1210, may cause the processor 1210 to perform one or more steps described herein. According to aspects of one or more embodiments, examples of computer-readable media may include, but are not limited to, an electronic, optical, magnetic, or other storage or transmission device capable of providing a processor, such as the processor 1210 of client device 1202a, with computer-readable instructions. According to aspects of one or more embodiments, other examples of suitable media may include, but are not limited to, a floppy disk, CD-ROM, DVD, magnetic disk, memory chip, ROM, RAM, an ASIC, a configured processor, all optical media, all magnetic tape or other magnetic media, or any other medium from which a computer processor can read instructions. Also, various other forms of computer-readable media may transmit or carry instructions to a computer, including a router, private or public network, or other transmission device or channel, both wired and wireless. According to aspects of one or more embodiments, the instructions may comprise code from any computer-programming language, including, for example, C, C++, Visual Basic, Java, Python, Perl, JavaScript, and etc.

According to aspects of one or more embodiments, client devices 1202a through 1202n may also comprise a number of external or internal devices such as a mouse, a CD-ROM, DVD, a physical or virtual keyboard, a display, or other input or output devices. According to aspects of one or more embodiments, examples of client devices 1202a through 1202n (e.g., clients) may be any type of processor-based platforms that are connected to a network 1206 such as, without limitation, personal computers, digital assistants, personal digital assistants, smart phones, pagers, digital tablets, laptop computers, Internet appliances, and other processor-based devices. According to aspects of one or more embodiments; client devices 1202a through 1202n may be specifically programmed with one or more application programs in accordance with one or more principles/methodologies detailed herein. According to aspects of one or more embodiments, client devices 1202a through 1202n may operate on any operating system capable of supporting a browser or browser-enabled application, such as Microsoft™, Windows™, and/or Linux. According to aspects of one or more embodiments, client devices 1202a through 1202n shown may include, for example, personal computers executing a browser application program such as Microsoft Corporation's Internet Explorer™, Apple Computer, Inc.'s Safari™, Mozilla Firefox, and/or Opera. According to aspects of one or more embodiments, through the member computing client devices 1202a through 1202n, user 1212a, user 1212b through user 1212n, may communicate over the exemplary network 1206 with each other and/or with other systems and/or devices coupled to the network 1206. As shown in FIG. 12, exemplary server devices 1204 and 1213 may include processor 1205 and processor 1214, respectively, as well as memory 1217 and memory 1216, respectively. According to aspects of one or more embodiments, the server devices 1204 and 1213 may be also coupled to the network 1206. According to aspects of one or more embodiments, one or more client devices 1202a through 1202n may be mobile clients.

According to aspects of one or more embodiments, at least one database of exemplary databases 1207 and 1215 may be any type of database, including a database managed by a database management system (DBMS). According to aspects of one or more embodiments, an exemplary DBMS-managed database may be specifically programmed as an engine that controls organization, storage, management, and/or retrieval of data in the respective database. According to aspects of one or more embodiments, the exemplary DBMS-managed database may be specifically programmed to provide the ability to query, backup and replicate, enforce rules, provide security, compute, perform change and access logging, and/or automate optimization. According to aspects of one or more embodiments, the exemplary DBMS-managed database may be chosen from Oracle database, IBM DB2, Adaptive Server Enterprise, FileMaker, Microsoft Access, Microsoft SQL Server, MySQL, PostgreSQL, and a NoSQL implementation. According to aspects of one or more embodiments, the exemplary DBMS-managed database may be specifically programmed to define each respective schema of each database in the exemplary DBMS, according to a particular database model of the present disclosure which may include a hierarchical model, network model, relational model, object model, or some other suitable organization that may result in one or more applicable data structures that may include fields, records, files, and/or objects. According to aspects of one or more embodiments, the exemplary DBMS-managed database may be specifically programmed to include metadata about the data that is stored.

Figure 13:
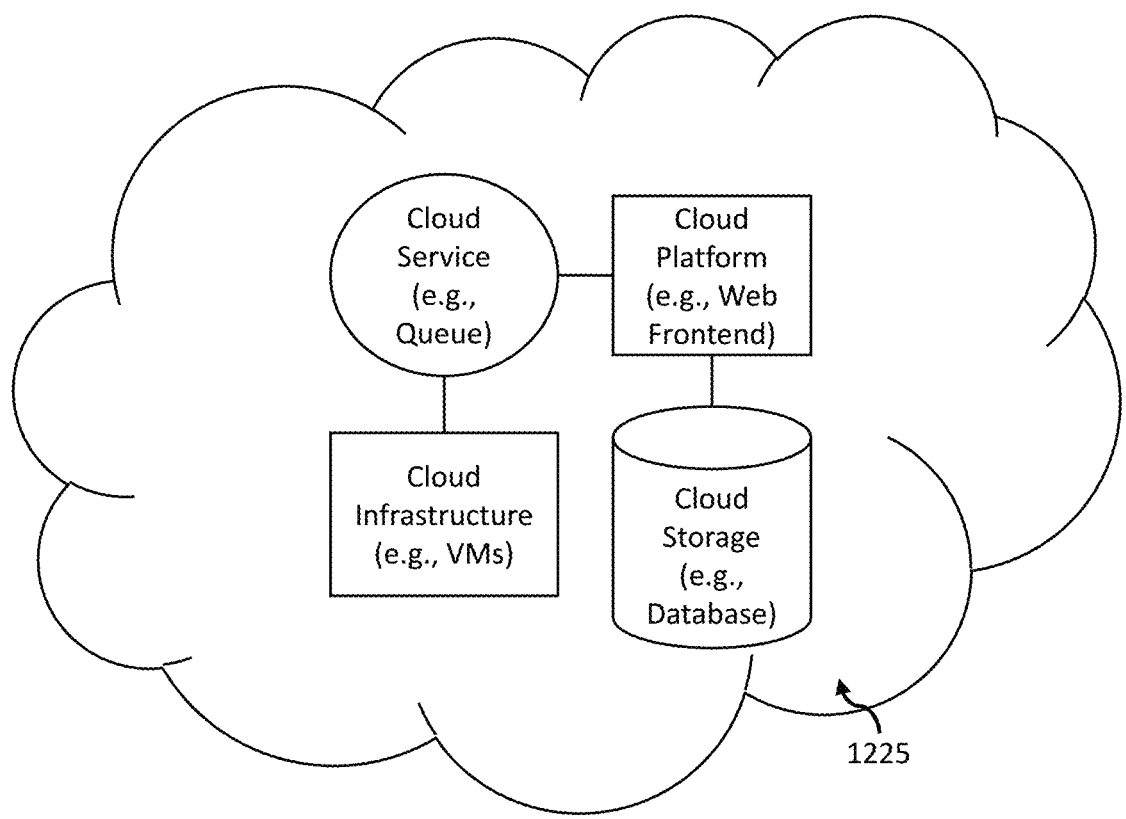
FIG. 13 depicts illustrative schematics of an exemplary implementation of the cloud computing/architecture(s) in which embodiments of a computer-based simulator for simulation of space-based imaging of RSOs may be specifically configured to operate in accordance with some embodiments of the present disclosure.
Figure 14:
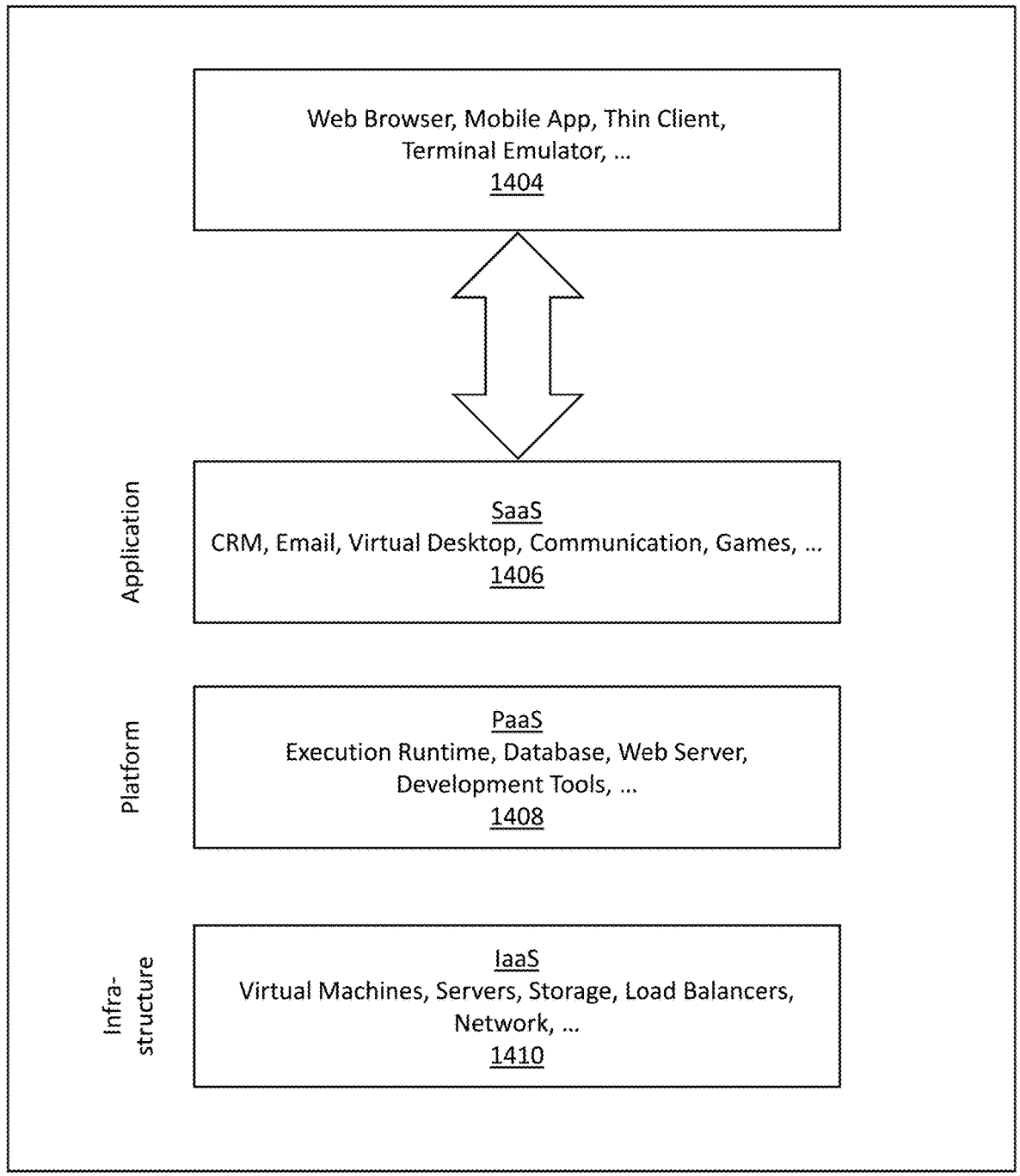
FIG. 14 depicts illustrative schematics of another exemplary implementation of the cloud computing/architecture(s) in which embodiments of a system for computer-based simulator for simulation of space-based imaging of RSOs may be specifically configured to operate in accordance with some embodiments of the present disclosure.

According to aspects of one or more embodiments, the exemplary inventive computer-based systems/platforms, the exemplary inventive computer-based devices, and/or the exemplary inventive computer-based components of the present disclosure may be specifically configured to operate in a cloud computing/architecture 1225 such as, but not limiting to: infrastructure a service (IaaS) 1410, platform as a service (PaaS) 1408, and/or software as a service (SaaS) 1406 using a web browser, mobile app, thin client, terminal emulator or other endpoint 1404. FIGS. 13 and 14 illustrate schematics of exemplary implementations of the cloud computing/architecture(s) in which the exemplary inventive computer-based systems/platforms, the exemplary inventive computer-based devices, and/or the exemplary inventive computer-based components of the present disclosure may be specifically configured to operate.

FIG. 15 illustrates an example WISE response per photon for W1 to W4 based on quantum efficiencies and optic transmissions for a sensor of a simulated satellite in accordance with one or more embodiments of the present disclosure.

It is understood that at least one aspect/functionality of various embodiments described herein can be performed in real-time and/or dynamically. As used herein, the term "real-time" is directed to an event/action that can occur instantaneously or almost instantaneously in time when another event/action has occurred. For example, the "real-time processing," "real-time computation," and "real-time execution" all pertain to the performance of a computation during the actual time that the related physical process (e.g., a user interacting with an application on a mobile device) occurs, in order that results of the computation can be used in guiding the physical process.

As used herein, the term "dynamically" and term "automatically," and their logical and/or linguistic relatives and/or derivatives, mean that certain events and/or actions can be triggered and/or occur without any human intervention. According to aspects of one or more embodiments, events and/or actions in accordance with the present disclosure can be in real-time and/or based on a predetermined periodicity of at least one of: nanosecond, several nanoseconds, millisecond, several milliseconds, second, several seconds, minute, several minutes, hourly, several hours, daily, several days, weekly, monthly, etc.

According to aspects of one or more embodiments, exemplary inventive, specially programmed computing systems and platforms with associated devices are configured to operate in the distributed network environment, communicating with one another over one or more suitable data communication networks (e.g., the Internet, satellite, etc.) and utilizing one or more suitable data communication protocols/modes such as, without limitation, IPX/SPX, X.25, AX.25, AppleTalk™, TCP/IP (e.g., HTTP), near-field wireless communication (NFC), RFID, Narrow Band Internet of Things (NBIOT), 3G, 4G, 5G, GSM, GPRS, WiFi, WiMax, CDMA, satellite, ZigBee, and other suitable communication modes.

The material disclosed herein may be implemented in software or firmware or a combination of them or as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

As used herein, the terms "computer engine" and "engine" identify at least one software component and/or a combination of at least one software component and at least one hardware component which are designed/programmed/configured to manage/control other software and/or hardware components (such as the libraries, software development kits (SDKs), objects, etc.).

Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. According to aspects of one or more embodiments, the one or more processors may be implemented as a Complex Instruction Set Computer (CISC) or Reduced Instruction Set Computer (RISC) processors; x86 instruction set compatible processors, multi-core, or any other microprocessor or central processing unit (CPU). In various implementations, the one or more processors may be dual-core processor(s), dual-core mobile processor(s), and so forth.

Computer-related systems, computer systems, and systems, as used herein, include any combination of hardware and software. Examples of software may include software components, programs, applications, operating system software, middleware, firmware, software modules, routines, subroutines, functions, methods, procedures, software interfaces, application program interfaces (API), instruction sets, computer code, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores," may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

According to aspects of one or more embodiments, one or more of illustrative computer-based systems or platforms of the present disclosure may include or be incorporated, partially or entirely into at least one personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

As used herein, term "server" should be understood to refer to a service point which provides processing, database, and communication facilities. By way of example, and not limitation, the term "server" can refer to a single, physical processor with associated communications and data storage and database facilities, or it can refer to a networked or clustered complex of processors and associated network and storage devices, as well as operating software and one or more database systems and application software that support the services provided by the server. Cloud servers are examples.

According to aspects of one or more embodiments, as detailed herein, one or more of the computer-based systems of the present disclosure may obtain, manipulate, transfer, store, transform, generate, and/or output any digital object and/or data unit (e.g., from inside and/or outside of a particular application) that can be in any suitable form such as, without limitation, a file, a contact, a task, an email, a message, a map, an entire application (e.g., a calculator), data points, and other suitable data. According to aspects of one or more embodiments, as detailed herein, one or more of the computer-based systems of the present disclosure may be implemented across one or more of various computer platforms such as, but not limited to: (1) FreeBSD, NetBSD, OpenBSD; (2) Linux; (3) Microsoft Windows™; (4) OpenVMS™; (5) OS X (MacOS™); (6) UNIX™; (7) Android; (8) iOS™; (9) Embedded Linux; (10) Tizen™; (11) WebOS™; (12) Adobe AIR™; (13) Binary Runtime Environment for Wireless (BREW™); (14) Cocoa™ (API); (15) Cocoa™ Touch; (16) Java™ Platforms; (17) JavaFX™; (18) QNX™; (19) Mono; (20) Google Blink; (21) Apple WebKit; (22) Mozilla Gecko™; (23) Mozilla XUL; (24). NET Framework; (25) Silverlight™; (26) Open Web Platform; (27) Oracle Database; (28) Qt™; (29) SAP NetWeaver™; (30) Smartface™; (31) Vexi™; (32) Kubernetes™ and (33) Windows Runtime (WinRT™) or other suitable computer platforms or any combination thereof. According to aspects of one or more embodiments, illustrative computer-based systems or platforms of the present disclosure may be configured to utilize hardwired circuitry that may be used in place of or in combination with software instructions to implement features consistent with principles of the disclosure. Thus, implementations consistent with principles of the disclosure are not limited to any specific combination of hardware circuitry and software. For example, various embodiments may be embodied in many different ways as a software component such as, without limitation, a stand-alone software package, a combination of software packages, or it may be a software package incorporated as a "tool" in a larger software product.

For example, exemplary software specifically programmed in accordance with one or more principles of the present disclosure may be downloadable from a network, for example, a website, as a stand-alone product or as an add-in package for installation in an existing software application. For example, exemplary software specifically programmed in accordance with one or more principles of the present disclosure may also be available as a client-server software application, or as a web-enabled software application. For example, exemplary software specifically programmed in accordance with one or more principles of the present disclosure may also be embodied as a software package installed on a hardware device.

According to aspects of one or more embodiments, illustrative computer-based systems or platforms of the present disclosure may be configured to handle numerous concurrent users that may be, but is not limited to, at least 100 (e.g., but not limited to, 100-999), at least 1,000 (e.g., but not limited to, 1,000-9,999), at least 10,000 (e.g., but not limited to, 10,000-99,999), at least 100,000 (e.g., but not limited to, 100,000-999,999), at least 1,000,000 (e.g., but not limited to, 1,000,000-9,999,999), at least 10,000,000 (e.g., but not limited to, 10,000,000-99,999,999), at least 100,000,000 (e.g., but not limited to, 100,000,000-999,999,999), at least 1,000,000,000 (e.g., but not limited to, 1,000,000,000-999,999,999,999), and so on.

According to aspects of one or more embodiments, illustrative computer-based systems or platforms of the present disclosure may be configured to output to distinct, specifically programmed graphical user interface implementations of the present disclosure (e.g., a desktop, a web app., etc.). In various implementations of the present disclosure, a final output may be displayed on a displaying screen which may be, without limitation, a screen of a computer, a screen of a mobile device, or the like. In various implementations, the display may be a holographic display. In various implementations, the display may be a transparent surface that may receive a visual projection. Such projections may convey various forms of information, images, or objects. For example, such projections may be a visual overlay for a mobile augmented reality (MAR) application.

As used herein, terms "cloud," "Internet cloud," "cloud computing," "cloud architecture," and similar terms correspond to at least one of the following: (1) a large number of computers connected through a real-time communication network (e.g., Internet); (2) providing the ability to run a program or application on many connected computers (e.g., physical machines, virtual machines (VMs)) at the same time; (3) network-based services, which appear to be provided by real server hardware, and are in fact served up by virtual hardware (e.g., virtual servers), simulated by software running on one or more real machines (e.g., allowing to be moved around and scaled up (or down) on the fly without affecting the end user).

According to aspects of one or more embodiments, the illustrative computer-based systems or platforms of the present disclosure may be configured to securely store and/or transmit data by utilizing one or more of encryption techniques (e.g., private/public key pair, Triple Data Encryption Standard (3DES), block cipher algorithms (e.g., IDEA, RC2, RC5, CAST and Skipjack), cryptographic hash algorithms (e.g., MD5, RIPEMD-160, RTRO, SHA-1, SHA-2, Tiger (TTH), WHIRLPOOL, RNGs).

As used herein, the term "user" shall have a meaning of at least one user. According to aspects of one or more embodiments, the terms "user", "subscriber" "consumer" or "customer" should be understood to refer to a user of an application or applications as described herein and/or a consumer of data supplied by a data provider. By way of example, and not limitation, the terms "user" or "subscriber" can refer to a person who receives data provided by the data or service provider over the Internet in a browser session or can refer to an automated software application which receives the data and stores or processes the data.

The aforementioned examples are, of course, illustrative and not restrictive.

At least some aspects of the present disclosure will now be described with reference to the following numbered clauses.

Clause 1. A method comprising: receiving, by at least one processor, a satellite constellation configuration comprising satellite configuration parameters for at least one satellite in a constellation of satellites; wherein the satellite constellation configuration comprises: at least one satellite geometry representing physical characteristics of the at least one satellite, and at least one sensor configuration representing sensor parameters of at least one sensor on board the at least one satellite; receiving, by the at least one processor, a resident space object (RSO) configuration comprising RSO configuration parameters for a plurality of RSOs, the RSO configuration comprising RSO geometry data representing physical characteristics of the plurality of RSOs; simulating, by the at least one processor, constellation ephemeris data comprising ephemerides of the at least one satellite of the constellation of satellites so as to define at least one satellite orbit propagation of the at least one satellite over a simulation period, based at least in part on the satellite constellation configuration; simulating, by the at least one processor, RSO ephemeris data comprising ephemerides of the plurality of RSOs so as to define, for each RSO of the plurality of RSOs, at least one RSO orbit propagation over the simulation period, based at least in part on the RSO configuration; determining, by the at least one processor, a plurality of candidate detection events representing a subset of the plurality of RSO kernels that, based on the constellation ephemeris data, is within a field-of-view (FOV) of the at least one satellite during the simulation period based at least in part on the plurality of observer kernels and the at least one sensor configuration; simulating, by the at least one processor, at least one detectable event of the plurality of candidate detection events, based at least in part on: at least one detectability model, the at least one sensor configuration and a plurality of detectability parameters; wherein the plurality of detectability parameters comprises: at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs; simulating, by the at least one processor, at least one simulated image of the at least one detectable event for at least one particular RSO, based at least in part on: at least one image generation model, the at least one sensor configuration and a plurality of image simulation l parameters; wherein the plurality of image simulation parameters comprise: the at least one photometry model based at least in part on the at least one sensor configuration, and the at least one background definition defining contents of a background of the FOV; outputting, by the at least one processor, the at least one event image associated with the at least one particular RSO so as to allow to perform at least one action associated with the at least one particular RSO.

Clause 2. The method of clause 1, wherein the satellite constellation configuration comprises at least one satellite orbit data representing orbital parameters of the at least one satellite;

Clause 3. The method of clause 1, further comprising: simulating, by the at least one processor, constellation ephemeris data comprising ephemerides of the at least one satellite of the constellation of satellites so as to define at least one satellite orbit propagation of the at least one satellite over a simulation period, based at least in part on: at least one satellite constellation numerical propagator, at least one satellite force model, and the satellite constellation configuration; wherein the at least one satellite constellation numerical propagator outputs a plurality of observer kernels for the at least one satellite, the plurality of observer kernels defining the constellation ephemeris data of the at least one satellite.

Clause 4. The method of clause 1, further comprising: simulating, by the at least one processor, RSO ephemeris data comprising ephemerides of the plurality of RSOs so as to define, for each RSO of the plurality of RSOs, at least one RSO orbit propagation over the simulation period, based at least in part on: at least one RSO numerical propagator, at least one RSO force model, and the RSO configuration; wherein the at least one RSO numerical propagator outputs a plurality of RSO kernels for the plurality of RSOs, the plurality of RSO kernels defining the RSO ephemeris data of the plurality of RSOs.

Clause 5. The method of clause 1, further comprising: calculating, by the at least one processor, at least one statistic for the at least one event image associated with the at least one particular RSO; wherein the at least one statistic is indicative of a performance of the at least one sensor configuration based at least in part on at least one of the at least one detectable event associated with the at least one particular RSO or the at least one event image associated with the at least one particular RSO.

Clause 6. The method of clause 1, wherein the plurality of image simulation parameters comprise at least one intrack/offtrack pixel uncertainty.

Clause 7. The method of clause 1, further comprising: accessing, by the at least one processor, at least one RSO catalog comprising two-line element data representing two-line elements of the plurality of RSOs.

Clause 8. The method of clause 1, wherein the at least one detectability model utilizes the at least one photometry model to simulate: a signal representing a first sensor output resulting from the subset of the plurality of RSO kernels being in the FOV of the at least one satellite based at least in part on the at least one sensor configuration, noise representing a second sensor output resulting from at least one background definition, at least one straylight model and at least one slew correction based at least in part on the at least one sensor configuration, and an SNR based at least in part on the signal and the noise.

Clause 9. The method of clause 1, wherein the image generation model is configured to: simulate star background imagery to depict the contents of the background based on the at least one background definition; simulate event imagery for the subset of the plurality of RSOs associated with the at least one detectable event based at least in part on the at least one photometry model, the at least one RSO configuration and the at least one sensor configuration; and generate at least one event image based at least in part on the star background imagery and the event imagery.

Clause 10. The method of clause 9, wherein the image generation model is further configured to: simulate noise imagery for the noise based at least in part on the at least one photometry model, the at least one sensor configuration and the noise; and generate at least one event image based at least in part on the star background imagery, the event imagery and the noise imagery.

Clause 11. A system comprising: at least one processor in communication with at least one non-transitory computer readable medium having software instructions stored thereon, wherein the at least one processor is, upon execution of the software instructions, configured to: receive a satellite constellation configuration comprising satellite configuration parameters for at least one satellite in a constellation of satellites; wherein the satellite constellation configuration comprises: at least one satellite geometry representing physical characteristics of the at least one satellite, and at least one sensor configuration representing sensor parameters of at least one sensor on board the at least one satellite; receive a resident space object (RSO) configuration comprising RSO configuration parameters for a plurality of RSOs, the RSO configuration comprising RSO geometry data representing physical characteristics of the plurality of RSOs; simulate constellation ephemeris data comprising ephemerides of the at least one satellite of the constellation of satellites so as to define at least one satellite orbit propagation of the at least one satellite over a simulation period, based at least in part on the satellite constellation configuration; simulate RSO ephemeris data comprising ephemerides of the plurality of RSOs so as to define, for each RSO of the plurality of RSOs, at least one RSO orbit propagation over the simulation period, based at least in part on the RSO configuration; determine a plurality of candidate detection events representing a subset of the plurality of RSO kernels that, based on the constellation ephemeris data, is within a field-of-view (FOV) of the at least one satellite during the simulation period based at least in part on the plurality of observer kernels and the at least one sensor configuration; simulate at least one detectable event of the plurality of candidate detection events, based at least in part on: at least one detectability model, the at least one sensor configuration and a plurality of detectability parameters; wherein the plurality of detectability parameters comprises: at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs; simulate at least one simulated image of the at least one detectable event for at least one particular RSO, based at least in part on: at least one image generation model, the at least one sensor configuration and a plurality of image simulation parameters; wherein the plurality of image simulation parameters comprise: the at least one photometry model based at least in part on the at least one sensor configuration, and the at least one background definition defining contents of a background of the FOV; output the at least one event image associated with the at least one particular RSO so as to allow to perform at least one action associated with the at least one particular RSO.

Clause 12. The system of clause 11, wherein the satellite constellation configuration comprises at least one satellite orbit data representing orbital parameters of the at least one satellite.

Clause 13. The system of clause 11, wherein the at least one processor, upon execution of the software instructions, is further configured to: simulate constellation ephemeris data comprising ephemerides of the at least one satellite of the constellation of satellites so as to define at least one satellite orbit propagation of the at least one satellite over a simulation period, based at least in part on: at least one satellite constellation numerical propagator, at least one satellite force model, and the satellite constellation configuration; wherein the at least one satellite constellation numerical propagator outputs a plurality of observer kernels for the at least one satellite, the plurality of observer kernels defining the constellation ephemeris data of the at least one satellite.

Clause 14. The system of clause 11, wherein the at least one processor, upon execution of the software instructions, is further configured to: simulate RSO ephemeris data comprising ephemerides of the plurality of RSOs so as to define, for each RSO of the plurality of RSOs, at least one RSO orbit propagation over the simulation period, based at least in part on: at least one RSO numerical propagator, at least one RSO force model, and the RSO configuration; wherein the at least one RSO numerical propagator outputs a plurality of RSO kernels for the plurality of RSOs, the plurality of RSO kernels defining the RSO ephemeris data of the plurality of RSOs.

Clause 15. The system of clause 11, wherein the at least one processor, upon execution of the software instructions, is further configured to: calculate at least one statistic for the at least one event image associated with the at least one particular RSO; wherein the at least one statistic is indicative of a performance of the at least one sensor configuration based at least in part on at least one of the at least one detectable event associated with the at least one particular RSO or the at least one event image associated with the at least one particular RSO.

Clause 16. The system of clause 11, wherein the plurality of image simulation parameters comprises at least one intrack/offtrack pixel uncertainty.

Clause 17. The system of clause 11, wherein the at least one processor, upon execution of the software instructions, is further configured to: access at least one RSO catalog comprising two-line element data representing two-line elements of the plurality of RSOs.

Clause 18. The system of clause 11, wherein the at least one detectability model utilizes the at least one photometry model to simulate: a signal representing a first sensor output resulting from the subset of the plurality of RSO kernels being in the FOV of the at least one satellite based at least in part on the at least one sensor configuration, noise representing a second sensor output resulting from at least one background definition, at least one straylight model and at least one slew correction based at least in part on the at least one sensor configuration, and an SNR based at least in part on the signal and the noise.

Clause 19. The system of clause 11, wherein the image generation model is configured to: simulate star background imagery to depict the contents of the background based on the at least one background definition; simulate event imagery for the subset of the plurality of RSOs associated with the at least one detectable event based at least in part on the at least one photometry model, the at least one RSO configuration and the at least one sensor configuration; and generate at least one event image based at least in part on the star background imagery and the event imagery.

Clause 20. The system of clause 19, wherein the image generation model is further configured to: simulate noise imagery for the noise based at least in part on the at least one photometry model, the at least one sensor configuration and the noise; and generate at least one event image based at least in part on the star background imagery, the event imagery and the noise imagery.

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the illustrative systems and platforms, and the illustrative devices described herein can be utilized in any combination with each other. Further still, the various steps may be carried out in any desired order (and any desired steps may be added and/or any desired steps may be eliminated).

What is claimed is:

1. A method comprising:
  receiving, by at least one processor, a satellite constellation configuration comprising satellite configuration parameters for at least one satellite in a constellation of satellites;
    wherein the satellite constellation configuration comprises:
      at least one satellite geometry representing physical characteristics of the at least one satellite, and
      at least one sensor configuration representing sensor parameters of at least one sensor on board the at least one satellite;
  receiving, by the at least one processor, a resident space object (RSO) configuration comprising RSO configuration parameters for a plurality of RSOs, the RSO configuration comprising RSO geometry data representing physical characteristics of the plurality of RSOs;
  simulating, by the at least one processor, constellation ephemeris data comprising ephemerides of the at least one satellite of the constellation of satellites so as to define at least one satellite orbit propagation of the at least one satellite over a simulation period, based at least in part on the satellite constellation configuration;
  simulating, by the at least one processor, RSO ephemeris data comprising ephemerides of the plurality of RSOs so as to define, for each RSO of the plurality of RSOs, at least one RSO orbit propagation over the simulation period, based at least in part on the RSO configuration;
  determining, by the at least one processor, a plurality of candidate detection events representing a subset of the RSO ephemeris data that, based on the constellation ephemeris data, is within a field-of-view (FOV) of the at least one satellite during the simulation period based at least in part on the constellation ephemeris data and the at least one sensor configuration;
  simulating, by the at least one processor, at least one detectable event of the plurality of candidate detection events, based at least in part on:
    at least one detectability model,
    the at least one sensor configuration and
    a plurality of detectability parameters;
    wherein the plurality of detectability parameters comprises:

at least one photometry model based at least in part on the at least one sensor configuration, at least one background definition defining contents of a background of the FOV, at least one straylight model, at least one slew correction, at least one threshold limit on signal-to-noise ratio (SNR), and at least one threshold limit on a size of the plurality of RSOs;

wherein the at least one detectability model utilizes the at least one photometry model to simulate:

a signal representing a first sensor output resulting from the subset of the RSO ephemeris data being in the FOV of the at least one satellite based at least in part on the at least one sensor configuration, noise representing a second sensor output resulting from at least one background definition, at least one straylight model and at least one slew correction based at least in part on the at least one sensor configuration, and an SNR;

simulating, by the at least one processor, at least one simulated image of the at least one detectable event for at least one particular RSO, based at least in part on:

at least one image generation model, the at least one sensor configuration and a plurality of image simulation parameters;

wherein the plurality of image simulation parameters comprise:

the at least one photometry model based at least in part on the at least one sensor configuration, and the at least one background definition defining contents of a background of the FOV;

calculating, by the at least one processor, at least one performance statistic for the at least one event image associated with the at least one particular RSO;

wherein the at least one performance statistic is indicative of a performance of the at least one sensor configuration for detecting events based at least in part on a count of the at least one detectable event relative to the plurality of candidate detection events; and outputting, by the at least one processor, the at least one event image associated with the at least one particular RSO and the at least one performance statistic so as to allow to perform at least one action associated with the at least one particular RSO.

2. The method of claim 1, wherein the satellite constellation configuration comprises at least one satellite orbit data representing orbital parameters of the at least one satellite.

3. The method of claim 1, further comprising:

simulating, by the at least one processor, constellation ephemeris data comprising ephemerides of the at least one satellite of the constellation of satellites so as to define at least one satellite orbit propagation of the at least one satellite over a simulation period, based at least in part on:

at least one satellite constellation numerical propagator, at least one satellite force model, and the satellite constellation configuration;

wherein the at least one satellite constellation numerical propagator outputs a plurality of observer kernels for the at least one satellite, the plurality of observer kernels defining the constellation ephemeris data of the at least one satellite.

4. The method of claim 1, further comprising:

simulating, by the at least one processor, RSO ephemeris data comprising ephemerides of the plurality of RSOs so as to define, for each RSO of the plurality of RSOs, at least one RSO orbit propagation over the simulation period, based at least in part on:

at least one RSO numerical propagator, at least one RSO force model, and the RSO configuration;

wherein the at least one RSO numerical propagator outputs a plurality of RSO kernels for the plurality of RSOs, the plurality of RSO kernels defining the RSO ephemeris data of the plurality of RSOs.

5. The method of claim 1, wherein the plurality of image simulation parameters comprises at least one intrack/offtrack pixel uncertainty.

6. The method of claim 1, further comprising:

accessing, by the at least one processor, at least one RSO catalog comprising two-line element data representing two-line elements of the plurality of RSOs.

7. The method of claim 1, wherein the image generation model is configured to:

simulate star background imagery to depict the contents of the background based on the at least one background definition;

simulate event imagery for the subset of the plurality of RSOs associated with the at least one detectable event based at least in part on the at least one photometry model, the at least one RSO configuration and the at least one sensor configuration; and generate at least one event image based at least in part on the star background imagery and the event imagery.

8. The method of claim 7, wherein the image generation model is further configured to:

simulate noise imagery for the noise based at least in part on the at least one photometry model, the at least one sensor configuration and the noise; and generate at least one event image based at least in part on the star background imagery, the event imagery and the noise imagery.

9. A system comprising:

at least one processor in communication with at least one non-transitory computer readable medium having software instructions stored thereon, wherein the at least one processor is, upon execution of the software instructions, configured to:

receive a satellite constellation configuration comprising satellite configuration parameters for at least one satellite in a constellation of satellites;

wherein the satellite constellation configuration comprises:

at least one satellite geometry representing physical characteristics of the at least one satellite, and at least one sensor configuration representing sensor parameters of at least one sensor on board the at least one satellite;

receive a resident space object (RSO) configuration comprising RSO configuration parameters for a plurality of RSOs, the RSO configuration comprising RSO geometry data representing physical characteristics of the plurality of RSOs;

simulate constellation ephemeris data comprising ephemerides of the at least one satellite of the constellation of satellites so as to define at least one satellite orbit propagation of the at least one satellite over a simulation period, based at least in part on the satellite constellation configuration;
simulate RSO ephemeris data comprising ephemerides of the plurality of RSOs so as to define, for each RSO of the plurality of RSOs, at least one RSO orbit propagation over the simulation period, based at least in part on the RSO configuration;
determine a plurality of candidate detection events representing a subset of the RSO ephemeris data that, based on the constellation ephemeris data, is within a field-of-view (FOV) of the at least one satellite during the simulation period based at least in part on the constellation ephemeris data and the at least one sensor configuration;
simulate at least one detectable event of the plurality of candidate detection events, based at least in part on:
at least one detectability model,
the at least one sensor configuration and
a plurality of detectability parameters;
wherein the plurality of detectability parameters comprises:
at least one photometry model based at least in part on the at least one sensor configuration,
at least one background definition defining contents of a background of the FOV,
at least one straylight model,
at least one slew correction,
at least one threshold limit on signal-to-noise ratio (SNR), and
at least one threshold limit on a size of the plurality of RSOs;
wherein the at least one detectability model utilizes the at least one photometry model to simulate:
a signal representing a first sensor output resulting from the subset of the RSO ephemeris data being in the FOV of the at least one satellite based at least in part on the at least one sensor configuration,
noise representing a second sensor output resulting from at least one background definition, at least one straylight model and at least one slew correction based at least in part on the at least one sensor configuration, and
an SNR;
simulate at least one simulated image of the at least one detectable event for at least one particular RSO, based at least in part on:
at least one image generation model,
the at least one sensor configuration and
a plurality of image simulation parameters;
wherein the plurality of image simulation parameters comprise:
the at least one photometry model based at least in part on the at least one sensor configuration, and
the at least one background definition defining contents of a background of the FOV;
calculate at least one statistic for the at least one event image associated with the at least one particular RSO;
wherein the at least one statistic is indicative of a performance of the at least one sensor configuration for detecting events based at least in part on a number of the at least one detectable event; and output the at least one event image associated with the at least one particular RSO so as to allow to perform at least one action associated with the at least one particular RSO.

10. The system of claim 9, wherein the satellite constellation configuration comprises at least one satellite orbit data representing orbital parameters of the at least one satellite.

11. The system of claim 9, wherein the at least one processor, upon execution of the software instructions, is further configured to:
simulate constellation ephemeris data comprising ephemerides of the at least one satellite of the constellation of satellites so as to define at least one satellite orbit propagation of the at least one satellite over a simulation period, based at least in part on:
at least one satellite constellation numerical propagator,
at least one satellite force model, and
the satellite constellation configuration;
wherein the at least one satellite constellation numerical propagator outputs a plurality of observer kernels for the at least one satellite, the plurality of observer kernels defining the constellation ephemeris data of the at least one satellite.

12. The system of claim 9, wherein the at least one processor, upon execution of the software instructions, is further configured to:
simulate RSO ephemeris data comprising ephemerides of the plurality of RSOs so as to define, for each RSO of the plurality of RSOs, at least one RSO orbit propagation over the simulation period, based at least in part on:
at least one RSO numerical propagator,
at least one RSO force model, and
the RSO configuration;
wherein the at least one RSO numerical propagator outputs a plurality of RSO kernels for the plurality of RSOs, the plurality of RSO kernels defining the RSO ephemeris data of the plurality of RSOs.

13. The system of claim 9, wherein the plurality of image simulation parameters comprises at least one intrack/offtrack pixel uncertainty.

14. The system of claim 9, wherein the at least one processor, upon execution of the software instructions, is further configured to:
access at least one RSO catalog comprising two-line element data representing two-line elements of the plurality of RSOs.

15. The system of claim 9, wherein the image generation model is configured to:
simulate star background imagery to depict the contents of the background based on the at least one background definition;
simulate event imagery for the subset of the plurality of RSOs associated with the at least one detectable event based at least in part on the at least one photometry model, the at least one RSO configuration and the at least one sensor configuration; and
generate at least one event image based at least in part on the star background imagery and the event imagery.

16. The system of claim 15, wherein the image generation model is further configured to:
simulate noise imagery for the noise based at least in part on the at least one photometry model, the at least one sensor configuration and the noise; and
generate at least one event image based at least in part on the star background imagery, the event imagery and the noise imagery.

17. The method of claim 1, wherein the at least one detectability model utilizes the at least one photometry model to simulate at least one of an Earth albedo, and
wherein the each RSO of the plurality of RSOs is in a low-Earth orbit (LEO).

18. The system of claim 9, wherein the at least one detectability model utilizes the at least one photometry model to simulate at least one of an Earth albedo, and
wherein the each RSO of the plurality of RSOs is in a low-Earth orbit (LEO).

19. A method comprising:
receiving, by at least one processor, a satellite constellation configuration comprising satellite configuration parameters for at least one satellite in a constellation of satellites;
wherein the satellite constellation configuration comprises:
at least one satellite geometry representing physical characteristics of the at least one satellite, and
at least one sensor configuration representing sensor parameters of at least one sensor on board the at least one satellite;
receiving, by the at least one processor, a resident space object (RSO) configuration comprising RSO configuration parameters for a plurality of RSOs, the RSO configuration comprising RSO geometry data representing physical characteristics of the plurality of RSOs;
simulating, by the at least one processor, constellation ephemeris data comprising ephemerides of the at least one satellite of the constellation of satellites so as to define at least one satellite orbit propagation of the at least one satellite over a simulation period, based at least in part on the satellite constellation configuration;
simulating, by the at least one processor, RSO ephemeris data comprising ephemerides of the plurality of RSOs so as to define, for each RSO of the plurality of RSOs, at least one RSO orbit propagation over the simulation period, based at least in part on the RSO configuration;
determining, by the at least one processor, a plurality of candidate detection events representing a subset of the RSO ephemeris data that, based on the constellation ephemeris data, is within a field-of-view (FOV) of the at least one satellite during the simulation period based at least in part on the constellation ephemeris data and the at least one sensor configuration;
simulating, by the at least one processor, at least one detectable event of the plurality of candidate detection events, based at least in part on:
at least one detectability model,
the at least one sensor configuration,
a plurality of detectability parameters, and
at least one photometry model based at least in part on the at least one sensor configuration,
simulating, by the at least one processor, at least one simulated image of the at least one detectable event for at least one particular RSO, based at least in part on:
at least one image generation model,
the at least one sensor configuration and
a plurality of image simulation parameters;
wherein the plurality of image simulation parameters comprise:
the at least one photometry model based at least in part on the at least one sensor configuration, and
at least one background definition defining contents of a background of the FOV;
wherein the image generation model is configured to:
simulate star background imagery to depict the contents of the background based on the at least one background definition;
simulate event imagery for the subset of the plurality of RSOs associated with the at least one detectable event based at least in part on the at least one photometry model, the at least one RSO configuration and the at least one sensor configuration; and
generate at least one event image based at least in part on the star background imagery and the event imagery,
calculating, by the at least one processor, at least one performance statistic for the at least one event image associated with the at least one particular RSO; and
outputting, by the at least one processor, the at least one event image associated with the at least one particular RSO and the at least one performance statistic so as to allow to perform at least one action associated with the at least one particular RSO.

20. The method of claim 19, wherein the image generation model is further configured to:
simulate noise imagery for the noise based at least in part on the at least one photometry model, the at least one sensor configuration and the noise; and
generate at least one event image based at least in part on the star background imagery, the event imagery and the noise imagery.

21. A system comprising:
at least one processor in communication with at least one non-transitory computer readable medium having software instructions stored thereon, wherein the at least one processor is, upon execution of the software instructions, configured to:
receive a satellite constellation configuration comprising satellite configuration parameters for at least one satellite in a constellation of satellites;
wherein the satellite constellation configuration comprises:
at least one satellite geometry representing physical characteristics of the at least one satellite, and
at least one sensor configuration representing sensor parameters of at least one sensor on board the at least one satellite;
receive a resident space object (RSO) configuration comprising RSO configuration parameters for a plurality of RSOs, the RSO configuration comprising RSO geometry data representing physical characteristics of the plurality of RSOs;
simulate constellation ephemeris data comprising ephemerides of the at least one satellite of the constellation of satellites so as to define at least one satellite orbit propagation of the at least one satellite over a simulation period, based at least in part on the satellite constellation configuration;
simulate RSO ephemeris data comprising ephemerides of the plurality of RSOs so as to define, for each RSO of the plurality of RSOs, at least one RSO orbit propagation over the simulation period, based at least in part on the RSO configuration;
determine a plurality of candidate detection events representing a subset of the RSO ephemeris data that, based on the constellation ephemeris data, is within a field-of-view (FOV) of the at least one satellite during the simulation period based at least in part on the constellation ephemeris data and the at least one sensor configuration;

simulate at least one detectable event of the plurality of candidate detection events, based at least in part on:
   at least one detectability model,
   the at least one sensor configuration,
   a plurality of detectability parameters, and
   at least one photometry model based at least in part on the at least one sensor configuration, simulate at least one simulated image of the at least one detectable event for at least one particular RSO, based at least in part on:
   at least one image generation model,
   the at least one sensor configuration and
   a plurality of image simulation parameters;
   wherein the plurality of image simulation parameters comprise:
      the at least one photometry model based at least in part on the at least one sensor configuration, and
      at least one background definition defining contents of a background of the FOV;
   wherein the image generation model is configured to:
      simulate star background imagery to depict the contents of the background based on the at least one background definition;
      simulate event imagery for the subset of the plurality of RSOs associated with the at least one detectable event based at least in part on the at least one photometry model, the at least one RSO configuration and the at least one sensor configuration; and
      generate at least one event image based at least in part on the star background imagery and the event imagery,
   calculate at least one performance statistic for the at least one event image associated with the at least one particular RSO; and
   output the at least one event image associated with the at least one particular RSO and the at least one performance statistic so as to allow to perform at least one action associated with the at least one particular RSO.

22. The system of claim 21, wherein the image generation model is further configured to:
   simulate noise imagery for the noise based at least in part on the at least one photometry model, the at least one sensor configuration and the noise; and
   generate at least one event image based at least in part on the star background imagery, the event imagery and the noise imagery.

* * * * *